(12) United States Patent
Maruyama

(10) Patent No.: US 7,825,728 B2
(45) Date of Patent: Nov. 2, 2010

(54) VARIABLE GAIN CIRCUIT

(75) Inventor: Masahiko Maruyama, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/458,632

(22) Filed: Jul. 17, 2009

(65) Prior Publication Data

US 2010/0045383 A1  Feb. 25, 2010

(30) Foreign Application Priority Data

Aug. 21, 2008  (JP) ............................ 2008-212599

(51) Int. Cl.
*H03F 3/45* (2006.01)
(52) U.S. Cl. ..................... 330/254; 330/260; 330/310
(58) Field of Classification Search ................. 330/254, 330/260, 310
See application file for complete search history.

(56) References Cited

U.S. PATENT DOCUMENTS

| | | | | |
|---|---|---|---|---|
| 3,737,798 A | * | 6/1973 | Faraguet et al. | 330/85 |
| 3,754,126 A | * | 8/1973 | Williams, Jr. | 702/175 |
| 3,927,938 A | * | 12/1975 | Seigenji | 355/38 |
| 4,340,854 A | * | 7/1982 | Jones et al. | 324/623 |
| 6,667,658 B2 | * | 12/2003 | Bourgoin et al. | 330/255 |
| 7,417,506 B2 | * | 8/2008 | Klein et al. | 330/254 |
| 7,625,118 B2 | * | 12/2009 | Mizuno | 374/111 |

FOREIGN PATENT DOCUMENTS

JP  08-330868  12/1996

* cited by examiner

*Primary Examiner*—Patricia Nguyen
(74) *Attorney, Agent, or Firm*—Harness, Dickey & Pierce, P.L.C.

(57) ABSTRACT

Provided is a variable gain circuit in which it is not necessary to provide a plurality of phase compensation capacities while stability of a circuit is maintained regardless of a set variable gain. A variable gain circuit comprises a precedent stage amplifier circuit for amplifying an external input signal, a subsequent stage amplifier circuit for amplifying an output signal of the precedent stage amplifier circuit, a phase compensation circuit having a fixed capacitative element and connected between an output terminal and an input terminal of the subsequent stage amplifier circuit, and a gain setting circuit adapted to be capable of setting a gain value of the whole of the precedent stage amplifier circuit and the subsequent stage amplifier circuit to a plurality of values, wherein one of the gain value and a transconductance value of the precedent stage amplifier circuit can be set in conjunction with the other.

9 Claims, 22 Drawing Sheets

VARIABLE GAIN CIRCUIT

CROSS REFERENCE TO RELATED APPLICATION

This Nonprovisional application claims priority under 35 U.S.C. §119(a) on Patent Application No. 2008-212599 filed in Japan on Aug. 21, 2008, the entire contents of which are hereby incorporated by reference.

BACKGROUND OF THE INVENTION

1. Field of the Invention

The present invention relates to a variable gain circuit and more particularly, to a variable gain circuit including a plurality of serially connected amplifier circuits, a phase compensation circuit, and a gain setting circuit.

2. Description of the Related Art

First, a constitution of a conventional variable gain circuit and its principle will be described. Here, FIG. 19 shows a schematic configuration of the conventional variable gain circuit.

A variable gain circuit 100 shown in FIG. 19 includes a differential amplifier circuit 110 to amplify an external input signal Vi, a feedback circuit 120 having two impedance elements Zs and Zf, gain controlling means 130 to set a gain value of the variable gain circuit 100, and a load capacity CL on the output side of the differential amplifier circuit 110.

The differential amplifier circuit 110 is composed of two amplifiers of a precedent stage amplifier DA1 and a subsequent stage amplifier DA2. According to the precedent stage amplifier DA1, the external input signal Vi is inputted to a positive side input terminal, and the impedance elements Zs and Zf of the feedback circuit 120 that will be described below are connected to a negative side input terminal. According to the subsequent amplifier DA2, an output terminal of the precedent stage amplifier DA1 is connected to an input terminal.

Since the differential amplifier circuit 110 shown in FIG. 19 is composed of the two amplifiers, it includes a phase compensation capacity Cc in order to ensure the stability of the circuit (refer to Gray Meyer et al., "Analysis and Design of Analog Integrated Circuits", JOHN WILEY & SONS, pp. 624-680). According to the phase compensation capacity Cc, one end is connected to the output terminal of the subsequent stage amplifier DA2, and the other end is connected to the input terminal of the subsequent stage amplifier DA2, in which the capacity is variable.

The feedback circuit 120 forms a negative feedback loop with the impedance elements Zs and Zf. According to the impedance element Zf, one end is connected to the output terminal of the subsequent stage amplifier DA2, and the other end is connected to the negative side input terminal of the precedent stage amplifier DA1. In addition, according to the impedance element Zs, one end is connected to the other end of the impedance element Zf and the other end is grounded. The impedance elements Zs and Zf include a capacitative element, a resistor element, or combination of the capacitative element and the resistor element in general. Here, the values of the impedance elements Zs and Zf are variable.

Here, when the differential gain of the differential amplifier circuit 110 is sufficiently great, a variable gain G of an output signal Vo with respect to an input signal Vi is expressed by the following formula 1.

$$G \equiv \frac{Vo}{Vi} = \frac{Zf}{Zs} + 1 \quad (1)$$

As shown in the formula 1, according to the variable gain circuit 100, when the values of the impedance elements Zs and Zf are appropriately set, a gain value can be set.

According to the variable gain circuit 100 shown in FIG. 19, as a signal amount of the negative feedback of the feedback circuit 120 is increased, the stability of the circuit is lowered. A feedback factor F showing the degree of the stability of the circuit is expressed by the following formula 2.

$$F \equiv \frac{Zs}{Zf + Zs} = \frac{1}{G} \quad (2)$$

As shown in the formula 2, the feedback factor F is designated by a ratio of the signal amount of the negative feedback of the feedback circuit 120 to a signal amount of the output signal Vo. As can be seen from the formula 2, as the value of the variable gain G is decreased, the feedback factor F is increased. That is, as the signal amount of the negative feedback is increased, the stability of the circuit is lowered.

In addition, when the value of the variable gain G is decreased, as a technique to keep the stability of the circuit, a variable gain circuit in which the capacity of the phase compensation capacity Cc is increased in conjunction with the decrease amount of the variable gain G is disclosed (refer to Japanese Patent Application Laid-Open No. 8-330868, for example, which is referred to as the patent document 1 hereinafter).

A description will be made of a relation between the variable gain G and the stability of the circuit with reference to FIGS. 20 and 21. Here, a phase margin is calculated from an open-loop transfer function in the negative feedback circuit.

Here, FIG. 20 shows a schematic circuit configuration when a negative feedback loop of the variable gain circuit (negative feedback circuit) shown in FIG. 19 is cut in order to provide the open-loop function. When it is assumed that a transfer function of the differential amplifier circuit 110 is H(s), the open-loop transfer function is expressed by a ratio of a voltage Vy of the negative feedback signal to a voltage difference Vid between the positive side input terminal and the negative side input terminal of the differential amplifier circuit 110, which is expressed by the following formula 3.

$$\frac{Vy}{Vid} = F \times H(s) \quad (3)$$

Then, the transfer function H(s) of the differential amplifier circuit 110 is calculated. Here, FIG. 21 shows an equivalent circuit of the differential amplifier circuit 110 composed of the two amplifiers of the precedent stage amplifier DA1 and the subsequent stage amplifier DA2.

In addition, FIG. 21A shows an equivalent circuit of the precedent stage amplifier DA1, in which Gm1 represents a transconductance value, R1 represents an amplifier output resistor, C1 represents an amplifier load capacity, s represents a Laplace operator, and Vx represents an output signal. In addition, FIG. 21B shows an equivalent circuit of the subsequent stage amplifier DA2, in which Gm2 represents a transconductance value, and R2 represents an amplifier output resistor.

When the Kirchihoffs current law is applied to an output node of the precedent stage amplifier DA1 of the differential amplifier circuit 110, the following formula 4 is provided.

$$Gm1 \times Vid + \frac{Vx}{R1} + Vx \times s \times C1 - s \times Cc \times Vo = 0 \qquad (4)$$

In addition, when the Kirchihoffs current law is applied to an output node of the subsequent stage amplifier DA2 of the differential amplifier circuit 110, the following formula 5 is provided.

$$Gm2 \times Vx + Vo \times s \times Cc + \frac{Vo}{R2} + Vo \times s \times CL = 0 \qquad (5)$$

The following formula 6 is provided from the formula 4 and the formula 5.

$$H(s) = \frac{Vo}{Vid} \approx \frac{Adc}{\left(1 + \frac{s}{\omega_{P1}}\right) \times \left(1 + \frac{s}{\omega_{P2}}\right)} \qquad (6)$$

$$Adc = Gm1 \times Gm2 \times R1 \times R2$$

$$\omega_{P1} = -\frac{1}{Gm2 \times R1 \times R2 \times Cc}$$

$$\omega_{P2} = -\frac{Gm2}{CL + Cc} \times \frac{Cc}{C1}$$

The following formula 7 is provided from the formula 3 and the formula 6.

$$F \times H(s) \approx \frac{F \times Adc}{\left(1 + \frac{s}{\omega_{P1}}\right) \times \left(1 + \frac{s}{\omega_{P2}}\right)} \qquad (7)$$

Here, when it is assumed that a frequency when the value of the open-loop transfer function F×H (s) is one is a unity frequency of $\omega_U$, in a case where a relation of $\omega_{P1} \ll \omega_U \ll \omega_{P2}$ is provided, the unity frequency $\omega_U$ is calculated by the following formula 8.

$$F \times H(j \times \omega_U) \approx \frac{F \times Adc}{\left|\frac{j \times \omega_U}{\omega_{P1}}\right|} = 1 \qquad (8)$$

$$\omega_U = F \times Adc \times \omega_{P1} = F \times \frac{Gm1}{Cc}$$

In addition, a relation $s = j \times \omega_U$ is provided in the formula 8. When it is assumed that $s = j \times \omega_U$ in the formula 7, the following formula 9 is provided.

$$F \times H(j \times \omega_U) = \frac{F \times Adc}{\left(1 + j \times \frac{F \times Adc \times \omega_{P1}}{\omega_{P1}}\right) \times \left(1 + j \times \frac{\omega_U}{\omega_{P2}}\right)} \approx \frac{1}{j \times \left(1 + \frac{\omega_U}{\omega_{P2}}\right)} \qquad (9)$$

According to the formula 9, a phase angle on the Gaussian plane in the case where the unity frequency $\omega_U$ is provided is calculated by the following formula 10.

$$\angle F \times H(j \times \omega_U) = -90° - \tan^{-1}\left(\frac{\omega_U}{\omega_{P2}}\right) \qquad (10)$$

Here, since the phase margin PM is defined by an angle allowance until a phase angle of the open-loop transfer function on the Gaussian plane when the unity frequency $\omega_U$ is provided, that is, the phase angle represented by the formula 10 reaches −180 degrees, the following formula 11 is provided.

$$-180° + PM = -90° - \tan^{-1}\left(\frac{\omega_U}{\omega_{P2}}\right) \qquad (11)$$

$$PM = 90° - \tan^{-1}\left(\frac{\omega_U}{\omega_{P2}}\right)$$

When $\omega_{P2}$ in the formula 6 and $\omega_U$ in the formula 8 are assigned to the formula 11, the following formula 12 is provided.

$$PM = 90° - \tan^{-1}\left[F \times \frac{Gm1}{Gm2} \times \left(\frac{CL}{Cc} + 1\right) \times \frac{C1}{Cc}\right] \qquad (12)$$

As can be seen from the formula 12, the phase margin PM of the variable gain circuit composed of the plurality of stages of the amplifiers is monotonically decreased as the feedback factor F is increased. In other words, when the feedback factor F is increased, the stability of the variable gain circuit 100 could be damaged.

Therefore, according to the variable gain circuit disclosed in the above patent document 1, when the feedback factor F is increased, that is, when the variable gain G is decreased, the phase compensation capacity Cc is increased to keep the phase margin PM roughly constant, whereby the stability of the circuit is kept roughly constant.

However, according to the variable gain circuit disclosed in the above patent document 1, since it is necessary to increase the phase compensation capacity Cc in response to the increment of the variable gain G, it is necessary to provide the plurality of phase compensation capacities Cc.

Thus, for example, when the capacitative element is formed in an integrated circuit, the problem is that a chip area is increased and production cost becomes high because the plurality of phase compensation capacities Cc is provided. In addition, in a case of a discrete circuit, since it is necessary to mount a plurality of discrete components for the capacity, the problem is that the discrete circuit becomes large as a whole and a production cost becomes high.

Therefore, it is required to provide a variable gain circuit in which it is not necessary to provide a plurality of phase compensation capacities Cc while stability of a circuit is maintained regardless of a set variable gain G, and a production cost is lowered.

SUMMARY OF THE INVENTION

The present invention was made in view of the above problems and it is an object of the present invention to provide a variable gain circuit in which it is not necessary to provide a plurality of phase compensation capacities while stability of a circuit is maintained regardless of a set variable gain.

In order to achieve the above object, according to the present invention, a variable gain circuit comprises a precedent stage amplifier circuit for amplifying an external input signal, a subsequent stage amplifier circuit for amplifying an output signal of the precedent stage amplifier circuit, and a gain setting circuit adapted to be capable of setting a gain value of a whole of the precedent stage amplifier circuit and the subsequent stage amplifier circuit to a plurality of values, wherein the variable gain circuit is configured so that one of the gain value and a transconductance value of the precedent stage amplifier circuit can be set in conjunction with the other.

Further preferably, according to the variable gain circuit having the above characteristics, the precedent stage amplifier circuit includes a plurality of amplifiers, and respective output terminals of the amplifiers are connected to an input terminal of the subsequent stage amplifier circuit, and a number of the amplifiers determined based on the set gain value are made active.

Still preferably, according to the variable gain circuit having the above characteristics, the precedent stage amplifier circuit includes a plurality of amplifiers, respective output terminals of the amplifiers are connected to an input terminal of the subsequent stage amplifier circuit through corresponding first switch circuits, and a number of the first switch circuits determined based on the set gain value are turned on and the other first switch circuits are turned off.

Still preferably, according to the variable gain circuit having the above characteristics, the precedent stage amplifier circuit includes an amplifier and a first current supply circuit for supplying a current to the amplifier, and the first current supply circuit sets a current value to be supplied to the amplifier based on the set gain value.

Still preferably, according to the variable gain circuit having the above characteristics, the precedent stage amplifier circuit includes an amplifier, the amplifier includes a plurality of transconductance cells each having a differential pair circuit and a second current supply circuit for supplying a current to the differential pair circuit, and an active load circuit to which an output current of the transconductance cells is inputted, and a number of the transconductance cells determined based on the set gain value are made active.

Still preferably, according to the variable gain circuit having the above characteristics, the precedent stage amplifier circuit includes an amplifier, the amplifier includes a plurality of transconductance cells each having a differential pair circuit and a second current supply circuit for supplying a current to the differential pair circuit, and an active load circuit to which an output current of the transconductance cells is inputted, respective output terminals of the transconductance cells are connected to the active load circuit through corresponding second switch circuits, and a number of the second switch circuits determined based on the set gain value are turned on and the other second switch circuits are turned off.

Still preferably, according to the variable gain circuit having the above characteristics, the precedent stage amplifier circuit includes an amplifier, the amplifier includes a transconductance cell having a differential pair circuit and a third current supply circuit for supplying a current to the differential pair circuit, and an active load circuit to which an output current of the transconductance cell is inputted, and the third current supply circuit sets a current value to be supplied to the amplifier based on the set gain value.

Still preferably, according to the variable gain circuit having the above characteristics, the precedent stage amplifier circuit includes a current mirror amplifier having a current mirror circuit and a fourth current supply circuit for supplying a current to the current mirror circuit, and the fourth current supply circuit sets a current amount to be supplied to the current mirror circuit based on the set gain value, whereby a current mirror ratio of the current mirror circuit is set.

Still preferably, according to the variable gain circuit having the above characteristics, the precedent stage amplifier circuit sets the transconductance value to be smaller as the gain value is decreased.

Furthermore, according to the present invention, a signal processing system comprises a variable gain circuit, the variable gain circuit comprising a precedent stage amplifier circuit for amplifying an external input signal, a subsequent stage amplifier circuit for amplifying an output signal of the precedent stage amplifier circuit, and a gain setting circuit adapted to be capable of setting a gain value of a whole of the precedent stage amplifier circuit and the subsequent stage amplifier circuit to a plurality of values, wherein the variable gain circuit is configured so that one of the gain value and a transconductance value of the precedent stage amplifier circuit can be set in conduction with the other.

According to the variable gain circuit having the above characteristics, since one of the gain value and the transconductance value of the precedent stage amplifier circuit can be set in conjunction with the other in the variable gain circuit having the plurality of stage amplifier circuits such as the precedent stage amplifier circuit and the subsequent stage amplifier circuit, even when a phase compensation circuit is not provided, the phase compensation can be implemented by setting the transconductance value of the subsequent stage amplifier circuit to a sufficiently great value. In other words, it is not necessary to provide a phase compensation capacity.

In addition, according to the variable gain circuit having the above characteristics, even in the case where the phase compensation circuit is provided, since it is not necessary to vary the phase compensation capacity of the phase compensation circuit, it is enough to provide one fixed capacitative element. In other words, since one of the variable gain G and the transconductance value Gm1 of the precedent stage amplifier circuit is set in conjunction with the other, that is, one of the feedback factor F (F=1/G in a case of a noninverting amplifier circuit, refer to the formula 2) and the transconductance value Gm1 of the precedent stage amplifier circuit is set in conjunction with the other according to the formula 12, the stability of the circuit can be ensured without varying the phase compensation capacitance Cc while a phase margin PM is kept constant.

Therefore, according to the variable gain circuit having the above characteristics, since one of the gain value G and the transconductance value Gm1 of the precedent stage amplifier circuit is set in conjunction with the other, it is not necessary to provide the plurality of phase compensation capacities, that is, the phase compensation capacity may not be provided or it is enough to provide one fixed capacity, so that a production cost can be effectively prevented from becoming high, as compared with the variable gain circuit according to the above patent document 1 in which the plurality of capacitative elements are needed. In addition, in the case of an integrated circuit, a circuit area is reduced, and in the case of a discrete circuit, the number of components can be reduced.

Here, FIG. 22 shows a configuration of the variable gain circuit having the above characteristics simply. A transfer function $G(s)_{CLOSED}$ of the variable gain circuit shown in FIG. 22 is expressed by the following formula 13.

$$(Vi - F \times Vo) \times H(s) = Vo \qquad (13)$$

$$G(s)_{CLOSED} \equiv \frac{Vo}{Vi} = \frac{1}{F} \times \frac{1}{1 + \frac{1}{F \times H(s)}}$$

In the formula 13, in the case where a relation $\omega_{P1} \ll \omega_U \ll \omega_{P2}$ is provided, when the formula 6 is applied to the formula 13, the following formula 14 is provided.

$$H(s) = \frac{Adc}{\left(1 + \frac{s}{\omega_{P1}}\right) \times \left(1 + \frac{s}{\omega_{P2}}\right)} \approx \frac{Adc}{1 + \frac{s}{\omega_{P1}}} \approx \frac{Adc \times \omega_{P1}}{s} = \frac{Gm1}{s \times Cc} \qquad (14)$$

The following formula 15 is provided from the formula 13 and the formula 14.

$$G(s)_{CLOSED} \equiv \frac{Vo}{Vi} = \frac{1}{F} \times \frac{1}{1 + \frac{s \times Cc}{F \times Gm1}} \qquad (15)$$

Here, since a system frequency $\omega_{BW}$ is defined by a frequency in which a gain deteriorates by −3 dB in general, and the following formula 16 is provided.

$$G(\omega_{BW})_{CLOSED} = \frac{1}{F} \times \left| \frac{1}{1 + \frac{j \times \omega_{BW} \times Cc}{F \times Gm1}} \right| = \frac{1}{F} \times \frac{1}{2} \qquad (16)$$

According to the formula 16, the system frequency $\omega_{BW}$ is calculated by the following formula 17.

$$\omega_{BW} = F \times \frac{Gm1}{Cc} \qquad (17)$$

As described above, according to the variable gain circuit having the above characteristics, since one of the variable gain G (feedback factor F) and the transconductance value Gm1 of the precedent stage amplifier circuit is set in conjunction with the other, the value of the right side of the formula 17 can be a constant value by controlling the F×Gm1 so as to be kept constant. In this case, it is understood that the system frequency $\omega_{BW}$ of the variable gain circuit having the above characteristics can be kept roughly constant regardless of the increase and decrease in variable gain G. That is, according to the variable gain circuit having the above characteristics, a signal band can be kept constant by setting one of the variable gain G (feedback factor F) and the transconductance value Gm1 of the precedent stage amplifier circuit in conjunction with the other.

In addition, the following formula 18 is provided from the formula 12 and the formula 17.

$$PM = 90° - \tan^{-1}\left[\frac{Cc \times \omega_{BW}}{Gm2} \times \left(\frac{CL}{Cc} + 1\right) \times \frac{C1}{Cc}\right] \qquad (18)$$

Since the formula 18 is not a function of the feedback factor F, the phase margin PM can be kept roughly constant regardless of the increase and decrease in variable gain G in the variable gain circuit having the above characteristics, that is, the stability of the circuit is not damaged as compared with the conventional variable gain circuit.

In addition, it is understood from the formula 17 and the formula 18 that the phase margin PM can be kept roughly constant by decreasing the transconductance value Gm1 of the precedent stage amplifier circuit in conjunction with the decrease in variable gain G (increase in feedback factor F), that is, the stability of the circuit is not damaged.

By the way, the transconductance value Gm1 of the MOS transistor is expressed by the following formula 19, wherein Ids represents a drain current of the MOS transistor, Vgs represents a voltage between a gate and a source, and Vth represents a threshold voltage.

$$Gm = \frac{2 \times Ids}{Vdsat} \qquad (19)$$

$$Vdsat \approx Vgs - Vth$$

In addition, a transconductance value Gt of a bipolar transistor is expressed by the following formula 20, wherein Ic represents a collector current.

$$Gt = \frac{Ic}{VT} \qquad (20)$$

$$VT \approx \frac{k \times T}{q}$$

It can be understood that the variable gain G can be changed while the stability of the circuit is maintained by increasing and decreasing the drain current Ids in conjunction with the increase and decrease in variable gain Gm when the precedent stage amplifier circuit is composed of the MOS transistor according to the formula 19, and by increasing and decreasing the collector current Ic in conjunction with the increase and decrease in variable gain Gt when the precedent stage amplifier circuit is composed of the bipolar transistor according to the formula 20.

Therefore, according to the configuration in which the precedent stage amplifier circuit includes one amplifier and a first current supply circuit to supply a current to the amplifier, and the first current supply circuit sets the current value to be supplied to the amplifier based on the set gain value, since the current value to be supplied to the amplifier in the precedent stage amplifier circuit is varied based on the increase and decrease in gain value (variable gain G), the gain value can be changed while the stability of the circuit is maintained. In addition, according to the variable gain circuit having the above configuration, since the current value to be supplied to the amplifier in the precedent stage amplifier circuit is varied based on the increase and decrease in gain value (variable gain G), when the gain value is small, the current amount supplied to the amplifier can be small, so that a power consumption can be lowered.

DESCRIPTION OF THE PREFERRED EMBODIMENTS

Embodiments of a variable gain circuit and a signal processing system according to the present invention (referred to as the "circuit of the present invention" and the "system of the present invention" occasionally hereinafter) will be described with reference to the drawings hereinafter.

First Embodiment

A first embodiment of the circuit of the present invention will be described with reference to FIG. 1. Here, FIG. 1 shows a schematic configuration of the circuit of the present invention according to this embodiment.

Figure 1B:
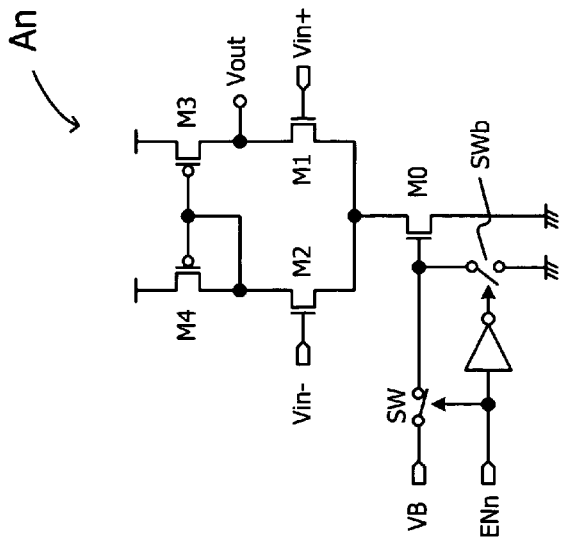
FIG. 1 is a schematic circuit diagram showing a circuit configuration example according to a first embodiment in a variable gain circuit according to the present invention.
Figure 1A:
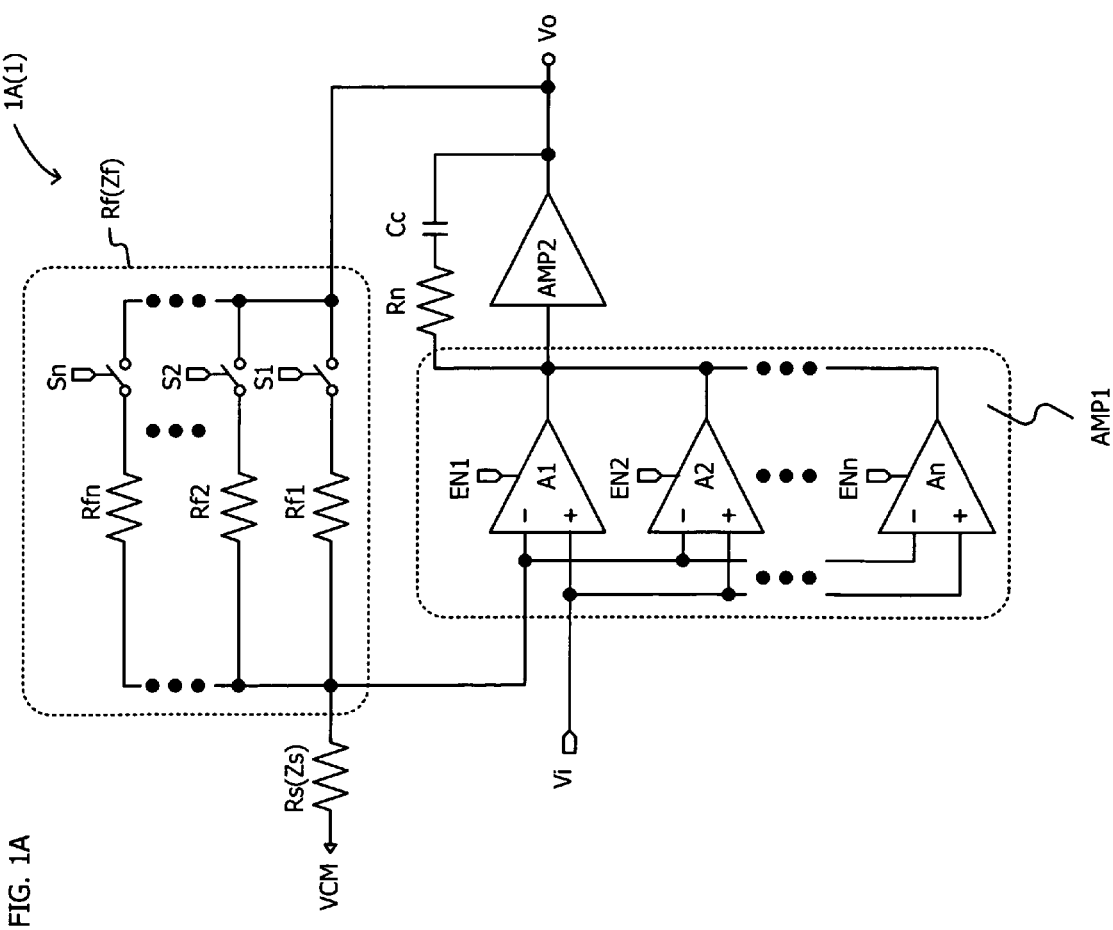

As shown in FIG. 1, a circuit 1A of the present invention includes a precedent stage amplifier circuit AMP1 to amplify an external input signal Vi, a subsequent stage amplifier circuit AMP2 to amplify an output signal of the precedent stage amplifier circuit AMP1, and a phase compensation circuit having a fixed capacitative element Cc and connected between an output terminal and an input terminal of the subsequent stage amplifier circuit AMP2, and a gain setting circuit adapted to be capable of setting a gain value of the whole of the precedent stage amplifier circuit AMP1 and the subsequent stage amplifier circuit AMP2 to a plurality of values, in which one of the gain value and a transconductance value of the precedent stage amplifier circuit AMP1 can be set in conjunction with the other.

More specifically, as shown in FIG. 1, the precedent stage amplifier circuit AMP1 includes amplifiers A1 to An connected in parallel. According to the amplifier Ai (i=1 to n), a feedback node of the gain setting circuit (a connecting point between a resistor circuit Rf and a resistor element Rs) that will be described below is connected to a negative side input terminal, and the external input signal Vi is connected to a positive side input terminal. In addition, an output terminal of the amplifier Ai (i=1 to n) is connected to the input terminal of the subsequent stage amplifier circuit AMP2. The amplifier Ai (=1 to n) according to this embodiment is made active or inactive based on an enable signal ENi. According to this embodiment, by appropriately controlling the enable signal ENi (i=1 to n), a certain number of amplifiers are made active based on the set gain value.

Here, FIG. 1B shows the configuration of the amplifier An. In addition, the amplifiers A1 to An have the same configuration.

As shown in FIG. 1B, the amplifier An includes N type MOS transistors M1 and M2 serving as a differential pair circuit, P type MOS transistors M3 and M4 serving as active loads to convert a current value of a differential signal to a voltage value, and an N type MOS transistor M0 serving as a constant current source to supply a constant current to the differential pair circuit. In addition, a reference voltage VB is inputted to a gate terminal of the N type MOS transistor M0 through a switch circuit SW turned on and off based on the enable signal ENn, and a ground voltage is inputted thereto through a switch circuit SWb turned on and off based on an inversion signal of the enable signal ENn.

In addition, in FIG. 1B, a transconductance value of the differential pair circuit composed of the N type MOS transistors M1 and M2 corresponds to a transconductance value of the amplifier An. When a current is supplied from the constant current source M0 to the differential pair circuit, the transconductance value is a predetermined value, and when a current is not supplied to the differential pair circuit, the transconductance value is zero.

The phase compensation circuit is composed of the fixed capacitative element Cc and a resistor element Rn connected in series.

Figure 22:
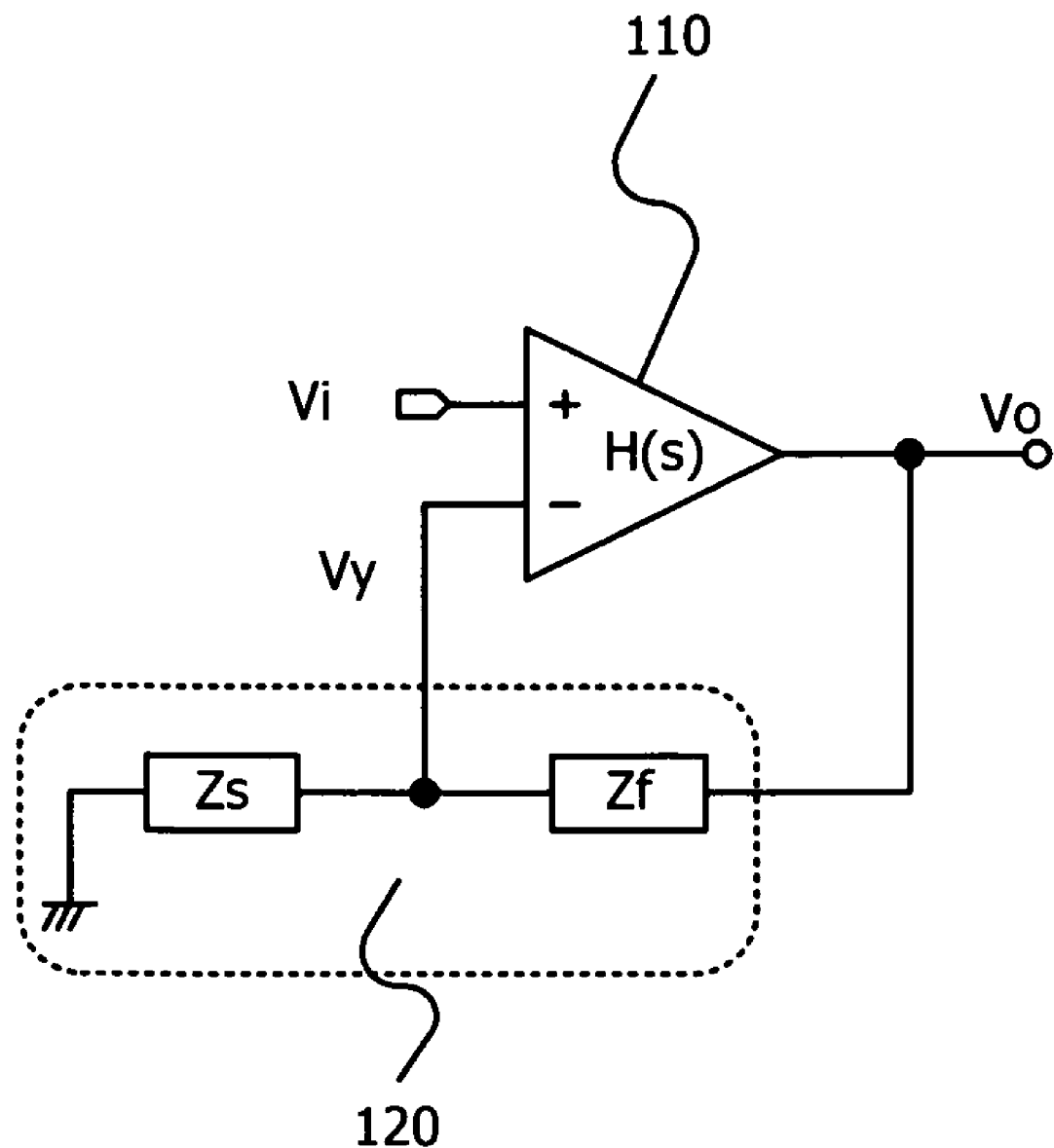
FIG. 22 is a schematic partial block diagram showing a schematic partial configuration of the variable gain circuit.

As shown in FIG. 1, the gain setting circuit includes a resistor circuit Rf (corresponding to a load impedance Zf shown in FIG. 22) in which series circuits in which resistor elements Rf1 to Rfn are connected to switch circuits in series are connected in parallel, and the resistor element Rs (corresponding to a load impedance Zs shown in FIG. 22). A variable gain G is set by controlling the switch circuit and setting the number of the resistor elements Rfi (i=1 to n) to be connected. More specifically, as the value of the resistor circuit Rf (value of the load impedance Zf) determined by the connected state of the resistor elements Rfi (i=1 to n) is decreased, that is, as the connected number of the resistor circuits Rf is increased, the value of the variable gain G is decreased, and a feedback factor F is increased (refer to the formula 1 and the formula 2). In addition, each value of the resistor elements R1 to Rn is set such that the product of a transconductance value Gm1 of the precedent stage amplifier circuit determined by the number of the active amplifiers Ai (i=1 to n), and the feedback factor F in a connected state based on each transconductance value Gm1 becomes constant.

Control of the circuit 1A of the present invention according to this embodiment will be described hereinafter.

As described above, as the value of the resistor circuit Rf determined by the connected state of the resistor elements Rfi (i=1 to n) is decreased, the value of the variable gain G is decreased. In addition, as the number of the active amplifiers A1 to An is decreased, the transconductance value Gm1 of the precedent stage amplifier circuit AMP1 is decreased.

Therefore, according to this embodiment, in order to control the value of F (=1/G)×Gm1 to be kept constant, when the variable gain G is decreased, the connected state is changed so as to decrease the value of the resistor circuit Rf, and accordingly the number of the active amplifiers A1 to An is decreased. In addition, when the variable gain G is increased, the connected state is changed so as to increase the value of the resistor circuit Rf, and accordingly the number of the active amplifiers A1 to An is increased.

According to the above control, the circuit 1A of the present invention can increase and decrease the variable gain G while a phase margin PM is kept constant. In addition, when the variable gain G is deceased, since the number of the active amplifiers A1 to An is decreased, that is, the number of the amplifiers A1 to An to which a current is supplied is decreased, a current consumption can be lowered.

An operational effect of the circuit 1 of the present invention will be quantitatively described with reference to FIGS. 2 to 6 hereinafter.

Figure 2:
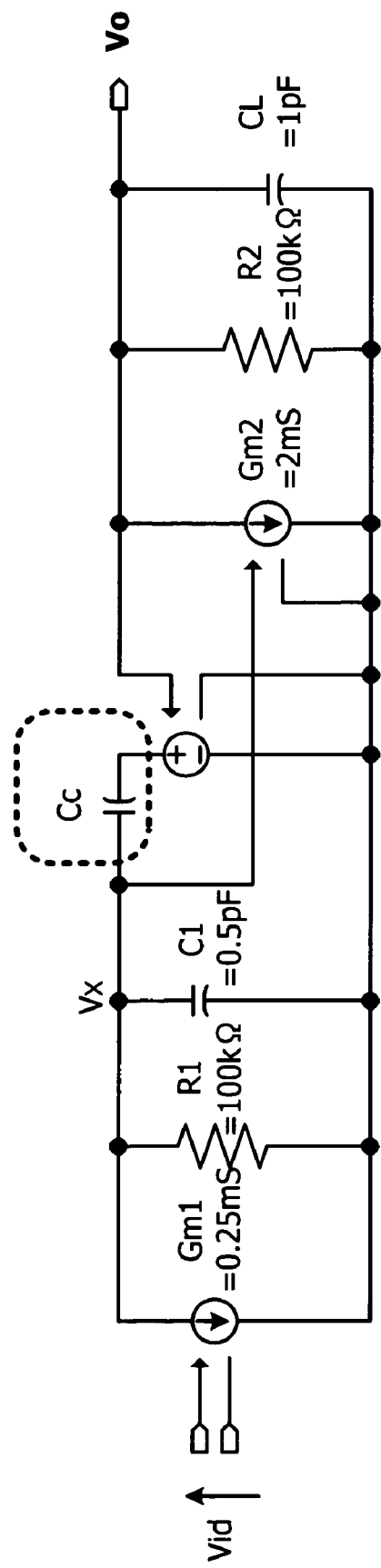
FIG. 2 shows an equivalent circuit of a variable gain circuit according to a conventional technique.
Figure 3:
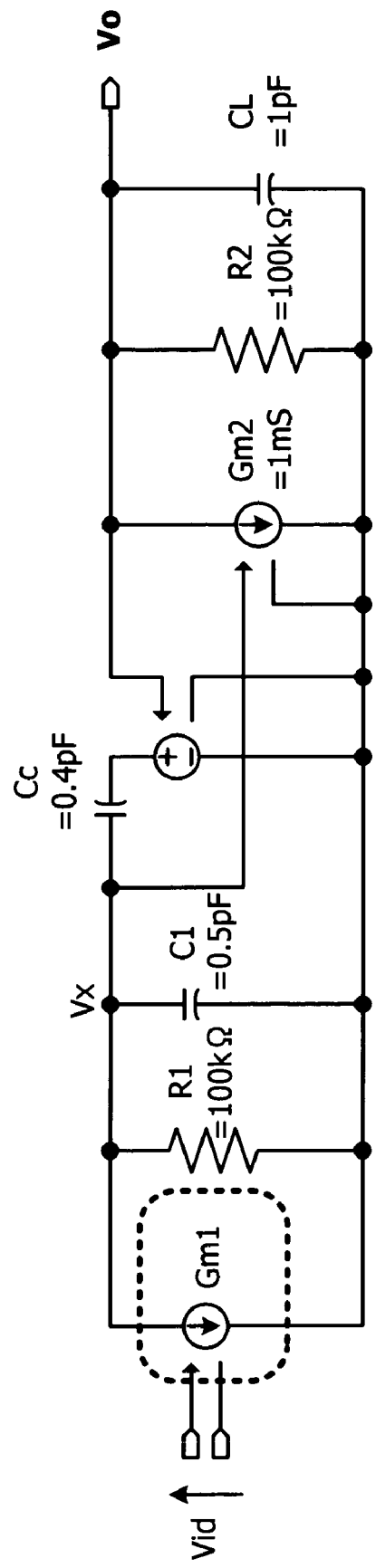
FIG. 3 shows an equivalent circuit of the variable gain circuit according to the present invention.

Here, FIG. 2 shows an equivalent circuit of a conventional variable gain circuit, and FIG. 3 shows an equivalent circuit of the circuit 1 of the present invention. As shown in FIGS. 2 and 3, it is assumed that a system frequency $\omega_{BW}$ (signal pass band) is set to $2\pi \times 10$ MHz, a capacity of a load capacity C1 is set to 0.5 pF, a capacity of a load capacity CL is set to 1 pF, and resistance values of the resistor element R1 and R2 are set to 100 kΩ respectively. In addition, the transconductance value Gm2 of the subsequent stage amplifier circuit AMP2 and the value of the phase compensation capacity Cc are set such that the phase margin is not less than 80 degrees.

In addition, according to the conventional technique shown in FIG. 2, the value of the phase compensation capacity Cc is set in conjunction with the feedback factor F, based on the formula 17 such that the system frequency $\omega_{BW}$ is kept constant. Meanwhile, according to the circuit 1 of the present invention shown in FIG. 3, the transconductance value Gm1 of the precedent stage amplifier circuit AMP1 is set in conjunction with the feedback factor F, based on the formula 17.

Figure 4:
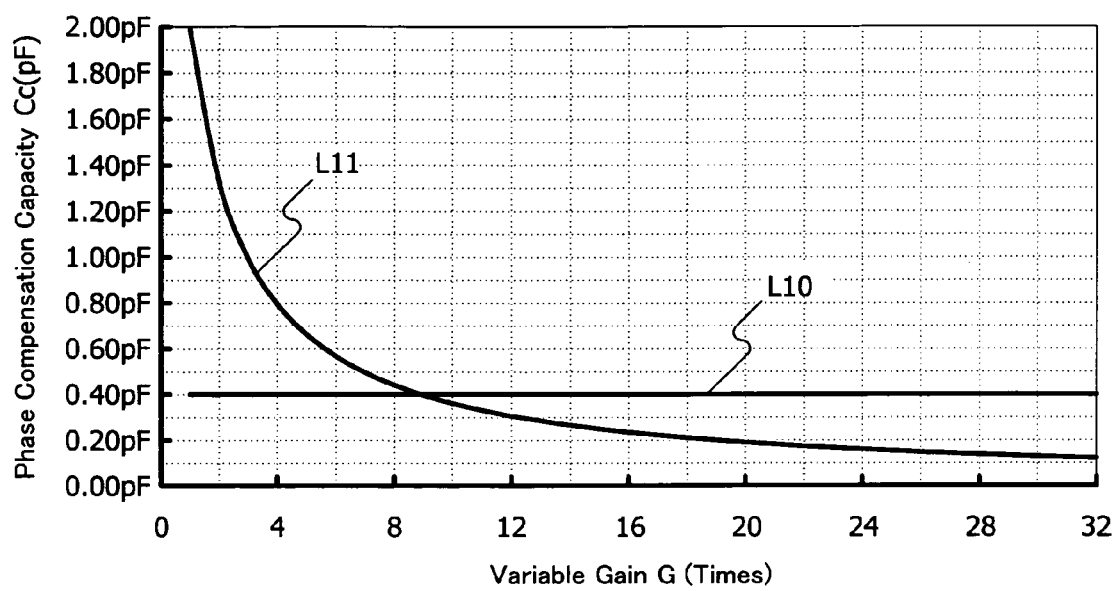
FIG. 4 is a graph showing a relation between a variable gain G and a phase compensation capacity Cc in each of the variable gain circuit according to the present invention and the variable gain circuit according to the conventional technique.

FIG. 4 shows a relation between the variable gain G and the phase compensation capacity Cc, in which L11 represents a value of the phase compensation capacity Cc with respect to the variable gain G in the variable gain circuit according to the conventional technique, and L10 represents a value of the phase compensation capacity Cc with respect to the variable gain G in the circuit 1 of the present invention. As can be understood from FIG. 4, since the capacity of the phase compensation capacity Cc can be kept constant in the circuit 1 of the present invention, only one phase compensation capacity Cc is enough, so that a circuit area of the integrated circuit can be reduced, or the number of the components in the discrete circuit can be reduced.

Figure 5:
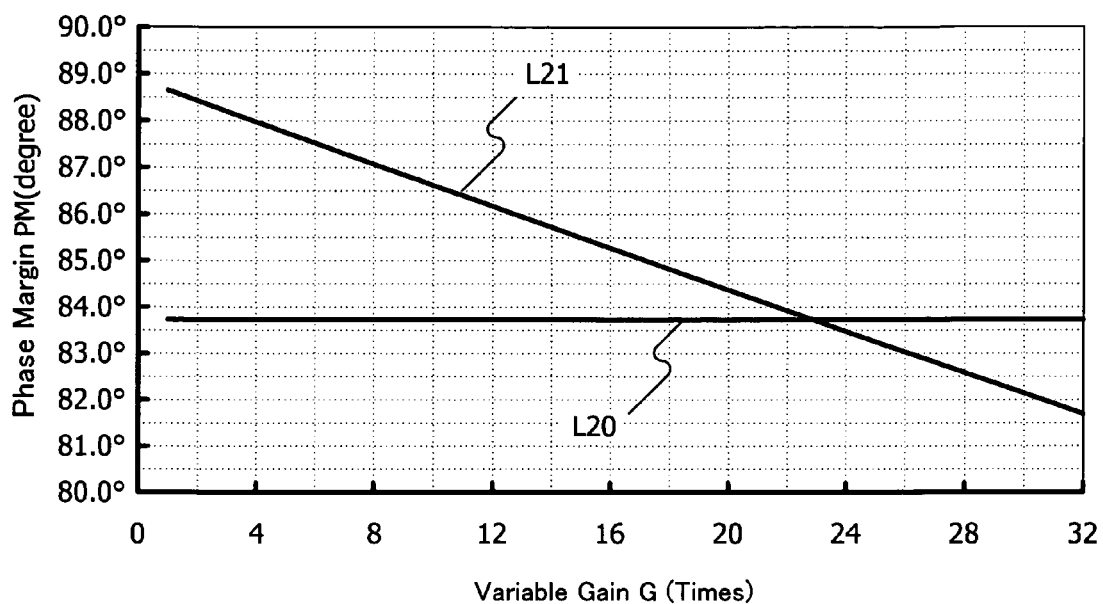
FIG. 5 is a graph showing a relation between the variable gain G and a phase margin PM in each of the variable gain circuit according to the present invention and the variable gain circuit according to the conventional technique.

FIG. 5 shows a relation between the variable gain G and the phase margin PM, in which L21 represents the degree of the phase margin PM with respect to the variable gain G in the variable gain circuit according to the conventional technique, and L20 represents the degree of the phase margin PM with respect to the variable gain G in the circuit 1 of the present invention. As can be understood from FIG. 5, while the degree of the phase margin PM varies in the variable gain circuit according to the conventional technique, the phase margin PM is kept constant in the circuit 1 of the present invention. In other words, according to the circuit 1 of the present invention, the stability of the circuit can be more effectively maintained than the variable gain circuit according to the conventional technique.

Figure 6:
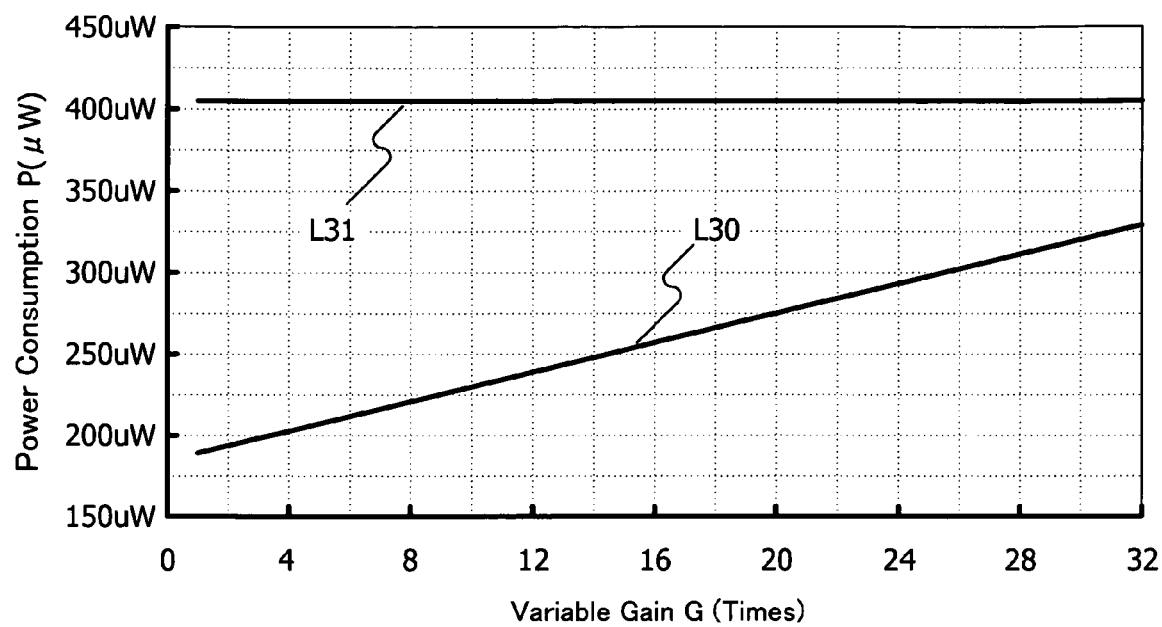
FIG. 6 is a graph showing a relation between the variable gain G and a power consumption P in each of the variable gain circuit according to the present invention and the variable gain circuit according to the conventional technique.

FIG. 6 shows a relation between the variable gain G and a power consumption P, in which L31 represents a value of the power consumption P with respect to the variable gain G in the variable gain circuit according to the conventional technique, and L30 represents a value of the power consumption P with respect to the variable gain G in the circuit 1 of the present invention. As can be understood from FIG. 6, as compared with the variable gain circuit according to the conventional technique, the value of the power consumption P of the circuit 1 of the present invention is lower, that is, the power consumption can be lowered.

Second Embodiment

A second embodiment of the circuit of the present invention will be described with reference to FIG. 7. In addition, in this embodiment, a description will be made of a case where a configuration of a precedent stage amplifier circuit AMP1 is different from that in the first embodiment.

Figure 7:
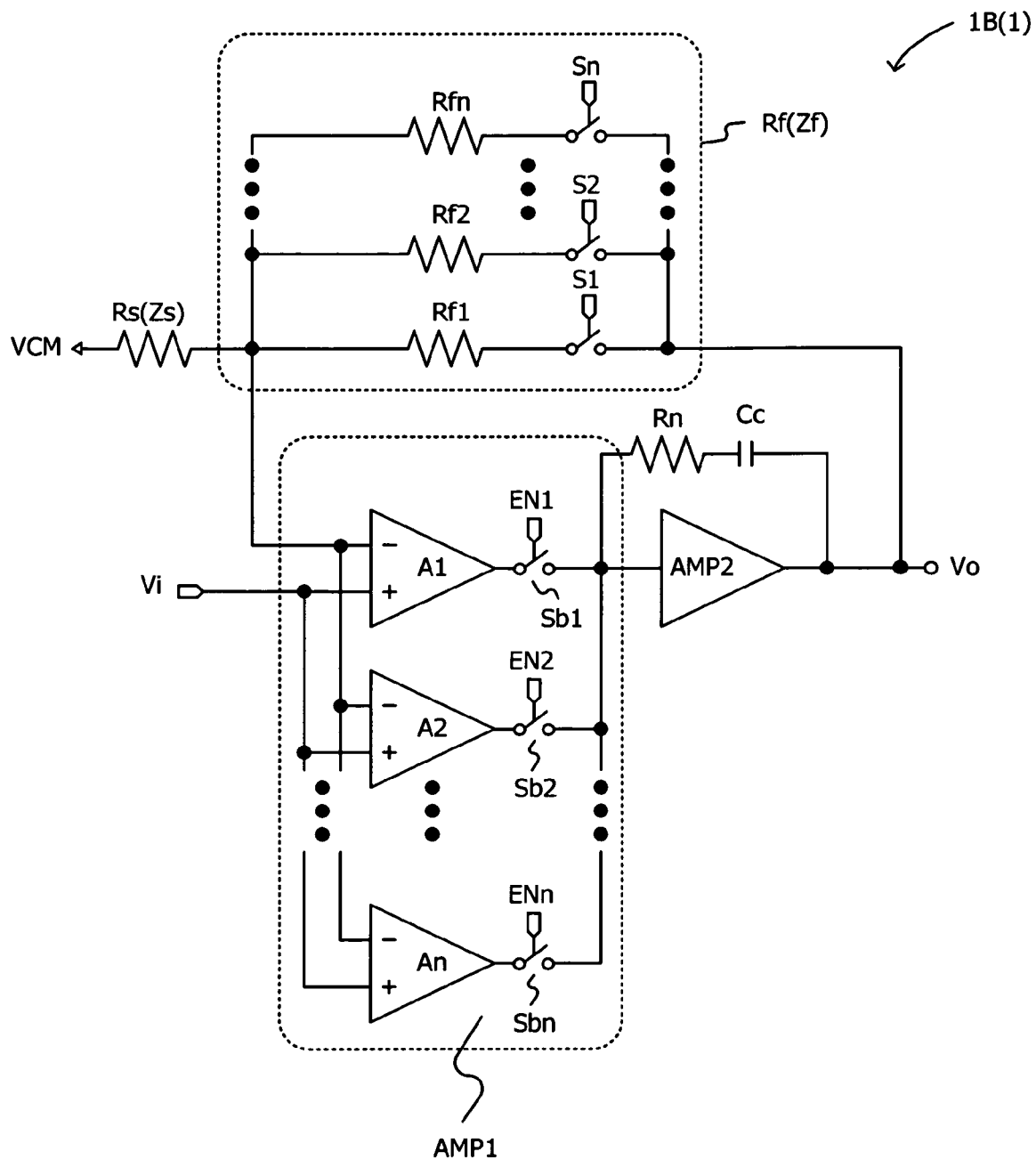
FIG. 7 is a schematic circuit diagram showing a circuit configuration example according to a second embodiment in a variable gain circuit according to the present invention.

Here, FIG. 7 shows a schematic configuration of the circuit of the present invention according to this embodiment. As shown in FIG. 7, a circuit 1B of the present invention according to this embodiment includes the precedent stage amplifier circuit AMP1 to amplify an external input signal Vi, a subsequent stage amplifier circuit AMP2 to amplify an output signal of the precedent stage amplifier circuit AMP1, and a phase compensation circuit having a fixed capacitative element Cc and connected between an output terminal and an input terminal of the subsequent stage amplifier circuit AMP2, and a gain setting circuit adapted to be capable of setting a gain value of the whole of the precedent stage amplifier circuit AMP1 and the subsequent stage amplifier circuit AMP2 to a plurality of values, in which one of the gain value and a transconductance value of the precedent stage amplifier circuit AMP1 can be set in conjunction with the other. In addition, the configurations of the subsequent stage amplifier circuit AMP2, the phase compensation circuit, and the gain setting circuit are the same as those in the first embodiment.

As shown in FIG. 7, the precedent stage amplifier circuit AMP1 includes a plurality of amplifiers A1 to An, and an output terminal of the amplifier Ai (i=1 to n) is connected to an input terminal of the subsequent stage amplifier circuit AMP2 through a first switch circuit Sbi (i=1 to n), in which a certain number of the first switch circuits determined based on a set gain value are turned on and the other first switch circuits are turned off. In addition, the configuration of the amplifier Ai (i=1 to n) is the same as that in the first embodiment.

Control of the circuit 1B of the present invention according to this embodiment will be described hereinafter.

Similar to the above first embodiment, as the value of the resistor circuit Rf determined by the connected state of the resistor elements Rfi (i=1 to n) of the gain setting circuit is decreased, the value of the variable gain G is decreased. In addition, according to this embodiment, as the number of the active amplifiers A1 to An connected to the subsequent stage amplifier circuit AMP2 is decreased, the transconductance value Gm1 of the precedent stage amplifier circuit AMP1 is decreased.

Therefore, according to this embodiment, when the variable gain G is decreased, the connected state is changed so as to decrease a value of a resistor circuit Rf, and accordingly the switch circuits Sbi (i=1 to n) is controlled and the number of the active amplifiers A1 to An connected to the subsequent stage amplifier circuit AMP2 is decreased. In addition, when the variable gain G is increased, the connected state is changed so as to increase the value of the resistor circuit Rf, and accordingly the switch circuits Sbi (i=1 to n) is controlled and the number of the active amplifiers A1 to An connected to the subsequent stage amplifier circuit AMP2 is increased.

According to the above control, the variable gain G can be increased and decreased with a simple configuration while a phase margin PM of the circuit 1B of the present invention is kept constant.

Third Embodiment

A third embodiment of a circuit of the present invention will be described with reference to FIG. 8. In addition, in this embodiment, a description will be made of a case where a configuration of a precedent stage amplifier circuit AMP1 is different from that in the first and second embodiments.

Figure 8:
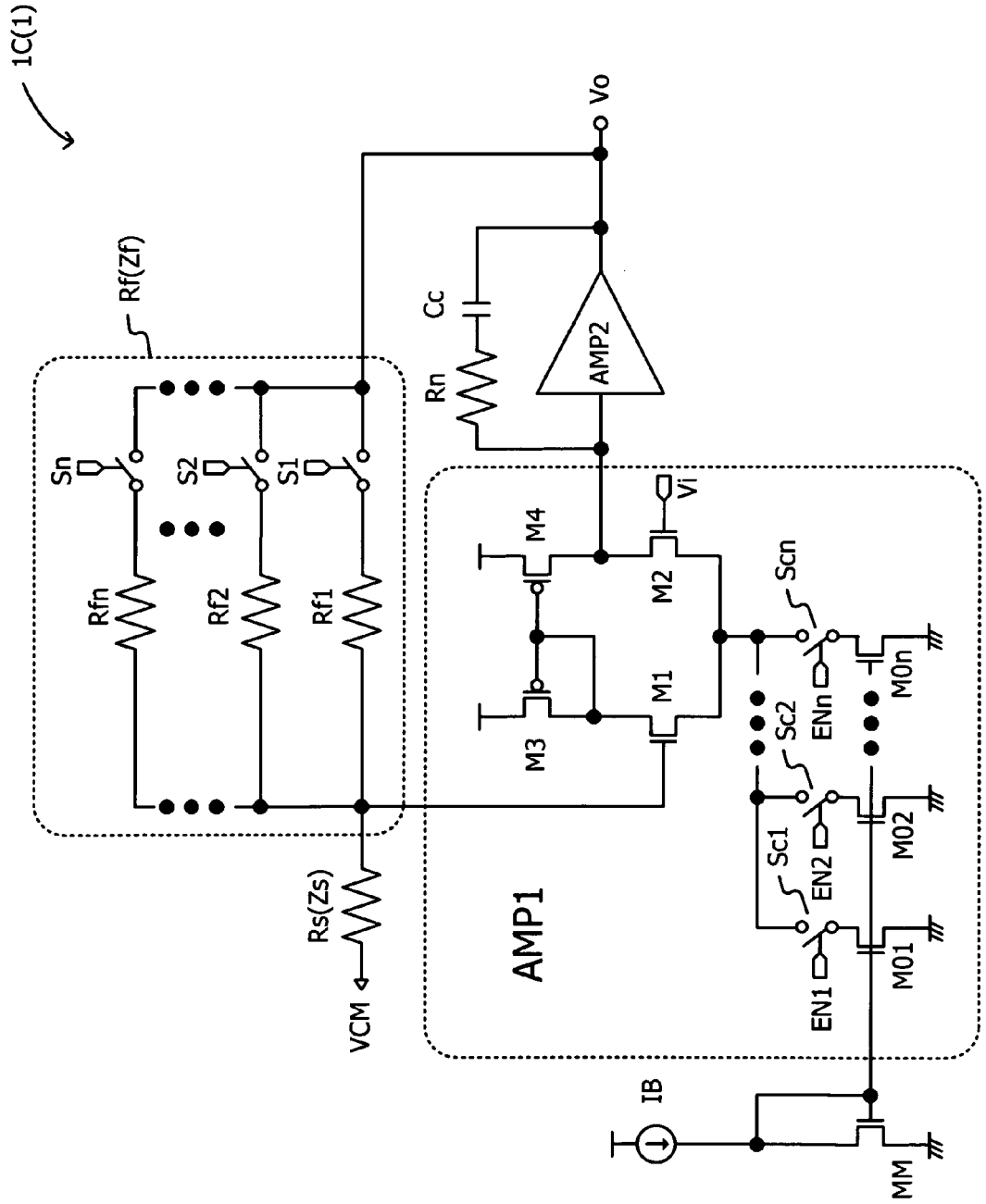
FIG. 8 is a schematic circuit diagram showing a circuit configuration example according to a third embodiment in a variable gain circuit according to the present invention.

Here, FIG. 8 shows a schematic configuration of the circuit of the present invention according to this embodiment. As shown in FIG. 8, a circuit 1C of the present invention according to this embodiment includes the precedent stage amplifier circuit AMP1 to amplify an external input signal Vi, a subsequent stage amplifier circuit AMP2 to amplify an output signal of the precedent stage amplifier circuit AMP1, a phase compensation circuit having a fixed capacitative element Cc and connected between an output terminal and an input terminal of the subsequent stage amplifier circuit AMP2, and a gain setting circuit adapted to be capable of setting a gain value of the whole of the precedent stage amplifier circuit AMP1 and the subsequent stage amplifier circuit AMP2 to a plurality of values, in which one of the gain value and a transconductance value of the precedent stage amplifier circuit AMP1 can be set in conjunction with the other. In addition, the configurations of the subsequent stage amplifier circuit AMP2, the phase compensation circuit, and the gain setting circuit are the same as those in the first and second embodiments.

The precedent stage amplifier circuit AMP1 according to this embodiment includes an amplifier, and a first current supply circuit to supply a current to the amplifier, in which the first current supply circuit sets a current value to be supplied to the amplifier based on the set gain value.

More specifically, as shown in FIG. 8, the precedent stage amplifier circuit AMP1 includes N type MOS transistors M1 and M2 serving as a differential pair circuit, P type MOS transistors M3 and M4 serving as active loads to convert a current value of a differential signal to a voltage value, N type MOS transistors M01 to M0$n$ serving as constant current sources to supply a constant current to the differential pair circuit, and switch circuits Sc1 to Scn to control the current supply from the constant current source to the differential pair circuit. In addition, according to this embodiment, the first current supply circuit is provided in the amplifier, and the N type MOS transistors M01 to M0$n$ and the switch circuits Sc1 to Scn are provided in the first current supply circuit.

In addition, as shown in FIG. 8, the N type MOS transistor M0$i$ (i=1 to n) serving as the first current supply circuit (tail current source) forms a current mirror circuit with an N type MOS transistor MM to which a current is supplied from a constant current source IB. According to the N type MOS transistor MM, its gate terminal and drain terminal are connected to the constant current source IB, and its source terminal is grounded. According to the N type MOS transistor M0$i$ (i=1 to n), its gate terminal is connected to the gate terminal and the drain terminal of the N type MOS transistor MM, its drain terminal is connected to the switch circuit Sci (i=1 to n), and its source terminal is grounded. The switch circuit Sci (i=1 to n) is turned on and off based on an enable signal ENi (i=1 to n).

Control of the circuit 1C of the present invention according to this embodiment will be described hereinafter.

Similar to the above first and second embodiments, as the value of a resistor circuit Rf determined by the connected state of the resistor elements Rfi (i=1 to n) is decreased, a value of a variable gain G is decreased. In addition, since the amplifier of the precedent stage amplifier circuit AMP1 is composed of the MOS transistors, as shown by the formula 19, as a drain current Ids of the N type MOS transistors M1 and M2 serving as the differential pair circuit is decreased, the transconductance value Gm1 of the precedent stage amplifier circuit AMP1 is decreased.

Therefore, according to this embodiment, when the variable gain G is decreased, the connected state is changed so as to decrease the value of the resistor circuit Rf, and accordingly the switch circuits Sci (i=1 to n) is controlled and a current amount supplied to the N type MOS transistors M1 and M2 serving as the differential pair circuit, that is, a current amount of the drain current of the N type MOS transistors M1 and M2 is decreased. In addition, when the variable gain G is increased, the connected state is changed so as to increase the value of the resistor circuit Rf, and accordingly the switch circuits Sci (i=1 to n) is controlled and the current amount supplied to the N type MOS transistors M1 and M2 (current amount of the drain current) is increased.

According to the above control, the variable gain G can be increased and decreased in the circuit 1C of the present invention while a phase margin PM is kept constant. In addition, when the variable gain G is decreased, since the current amount supplied to the amplifier is decreased, a current consumption can be lowered.

Fourth Embodiment

A fourth embodiment of a circuit of the present invention will be described with reference to FIG. 9. In addition, in this embodiment, a description will be made of a case where a configuration of a first current supply circuit of a precedent stage amplifier circuit AMP1 is different from that in the third embodiment.

Figure 9:
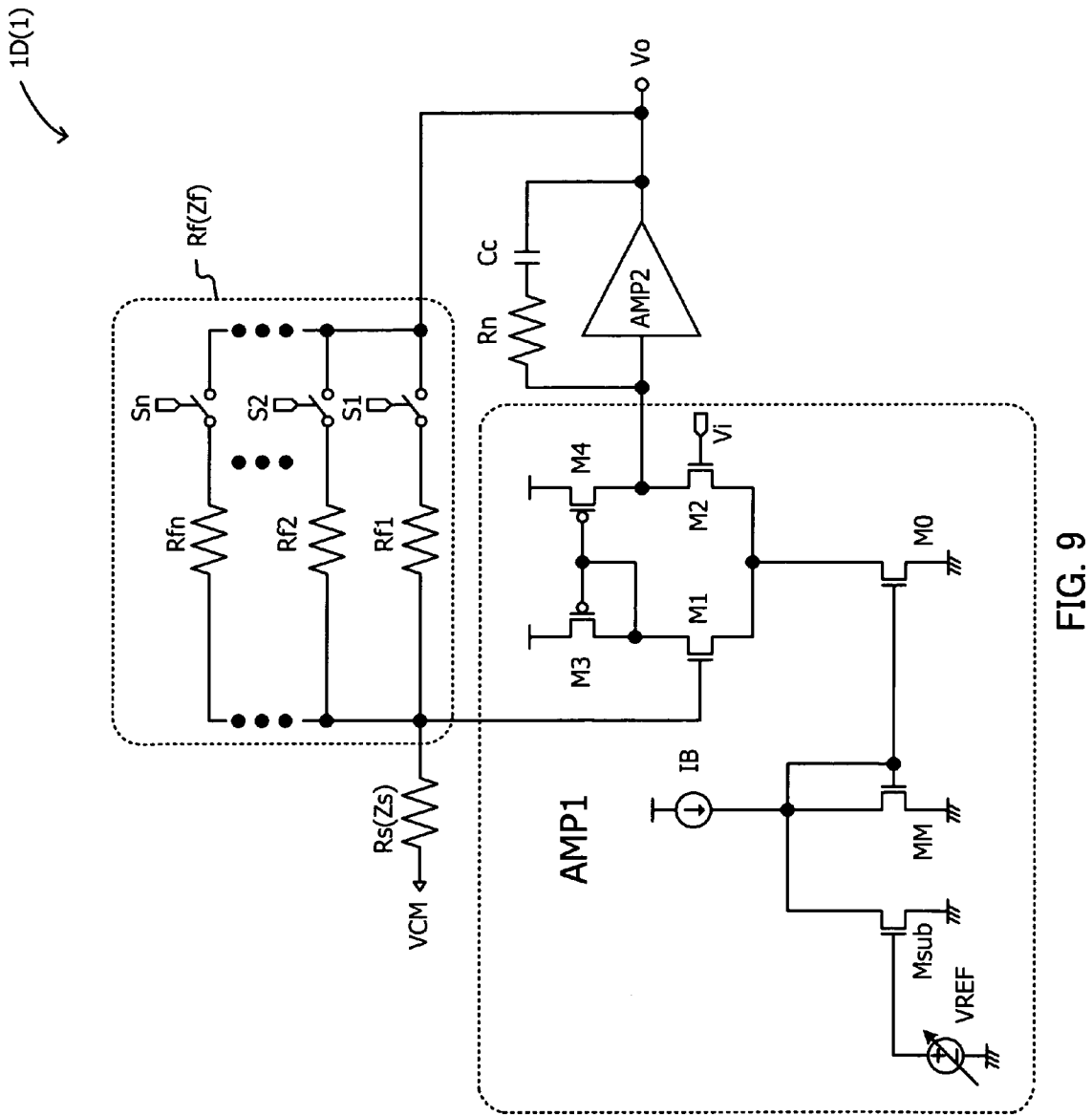
FIG. 9 is a schematic circuit diagram showing a circuit configuration example according to a fourth embodiment in a variable gain circuit according to the present invention.

Here, FIG. 9 shows a schematic configuration of the circuit of the present invention according to this embodiment. As shown in FIG. 9, a circuit 1D of the present invention according to this embodiment includes the precedent stage amplifier circuit AMP1 to amplify an external input signal Vi, a subsequent stage amplifier circuit AMP2 to amplify an output signal of the precedent stage amplifier circuit AMP1, a phase compensation circuit having a fixed capacitative element Cc and connected between an output terminal and an input terminal of the subsequent stage amplifier circuit AMP2, and a gain setting circuit adapted to be capable of setting a gain value of the whole of the precedent stage amplifier circuit AMP1 and the subsequent stage amplifier circuit AMP2 to a plurality of values, in which one of the gain value and a transconductance value of the precedent stage amplifier circuit AMP1 can be set in conjunction with the other. In addition, the configurations of the subsequent stage amplifier circuit AMP2, the phase compensation circuit, and the gain setting circuit are the same as those in the first to third embodiments.

Similar to the above third embodiment, the precedent stage amplifier circuit AMP1 according to this embodiment includes an amplifier, and a first current supply circuit to supply a current to the amplifier, in which the first current supply circuit sets a current value to be supplied to the amplifier based on the set gain value.

More specifically, as shown in FIG. 9, the precedent stage amplifier circuit AMP1 includes N type MOS transistors M1 and M2 serving as a differential pair circuit, P type MOS transistors M3 and M4 serving as active loads to convert a current value of a differential signal to a voltage value, and an N type MOS transistor M0 serving as a constant current source to supply a constant current to the differential pair circuit. In addition, the configurations of N type MOS transistors M1 and M2, and the P type MOS transistors M3 and M4 in the amplifier are the same as those in the third embodiment.

As shown in FIG. 9, the N type MOS transistor M0 serving as the first current supply circuit (tail current source) forms a current mirror circuit with an N type MOS transistor MM to which a current is supplied from a constant current source IB. According to the N type MOS transistor MM, its gate terminal and drain terminal are connected to the constant current source IB and a drain terminal of an N type MOS transistor Msub, and its source terminal is grounded. In addition, according to the N type MOS transistor Msub, its gate terminal is connected to a voltage source VREF, and its source terminal is grounded. According to the voltage source VREF, a voltage value is variable.

Control of the circuit 1D of the present invention according to this embodiment will be described hereinafter.

Similar to the above first to third embodiments, as the value of a resistor circuit Rf determined by the connected state of the resistor elements Rfi (i=1 to n) is decreased, a value of a variable gain G is decreased. In addition, since the amplifier of the precedent stage amplifier circuit AMP1 is composed of the MOS transistors, as shown by the formula 19, as a drain current Ids of the N type MOS transistors M1 and M2 serving as the differential pair circuit is decreased, a transconductance value Gm1 of the precedent stage amplifier circuit AMP1 is decreased.

Here, according to the circuit 1D of the present invention according to this embodiment, as the voltage value of the current source VREF in the first current supply circuit of the precedent stage amplifier circuit AMP1 is increased, the current value flowing in the N type MOS transistor Msub is increased. In this case, a current flowing in the N type MOS transistor MM is decreased, and a current amount of the N type MOS transistor M0 is decreased due to the current mirror, so that a drain current Ids of the N type MOS transistors serving as the differential pair circuit is decreased.

Therefore, according to this embodiment, when a variable gain G is decreased, the connected state is changed so as to decrease a value of a resistor circuit Rf, and accordingly the voltage value of the current source VREF is increased and the current amount Ids of the drain current of the N type MOS transistors M1 and M2 serving as the differential pair circuit is decreased. In addition, when the variable gain G is increased, the connected state is changed so as to increase the value of the resistor circuit Rf, and accordingly the voltage value of the current source VREF is decreased and the current amount of the drain current Ids of the N type MOS transistors M1 and M2 is increased.

According to the above control, similar to the third embodiment, the variable gain G can be increased and decreased in the circuit 1D of the present invention while a phase margin PM is kept constant. In addition, when the variable gain G is decreased, since the current amount supplied to the amplifier is decreased, a current consumption can be lowered.

Fifth Embodiment

A fifth embodiment of a circuit of the present invention will be described with reference to FIG. 10. In addition, in this embodiment, a description will be made of a case where a configuration of a precedent stage amplifier circuit AMP1 is different from those in the first to fourth embodiments.

Here, FIG. 10 shows a schematic configuration of the circuit of the present invention according to this embodiment. As shown in FIG. 10, a circuit 1E of the present invention according to this embodiment includes the precedent stage amplifier circuit AMP1 to amplify an external input signal Vi, a subsequent stage amplifier circuit AMP2 to amplify an output signal of the precedent stage amplifier circuit AMP1, a phase compensation circuit having a fixed capacitative element Cc and connected between an output terminal and an input terminal of the subsequent stage amplifier circuit AMP2, and a gain setting circuit adapted to be capable of setting a gain value of the whole of the precedent stage amplifier circuit AMP1 and the subsequent stage amplifier circuit AMP2 to a plurality of values, in which one of the gain value and a transconductance value of the precedent stage amplifier circuit AMP1 can be set in conjunction with the other. In addition, the configurations of the subsequent stage amplifier circuit AMP2, the phase compensation circuit, and the gain setting circuit are the same as those in the first and second embodiments.

The precedent stage amplifier circuit AMP1 according to this embodiment includes an amplifier, and the amplifier includes transconductance cells G1 to Gn composed of a differential pair circuit and a second current supply circuit to supply a current to the differential pair circuit, and an active load circuit to which an output current of the transconductance cell Gi (i=1 to n) is inputted, in which a certain number of transconductance cells Gi (i=1 to n) determined based on the set gain value are made active.

Figure 10B:
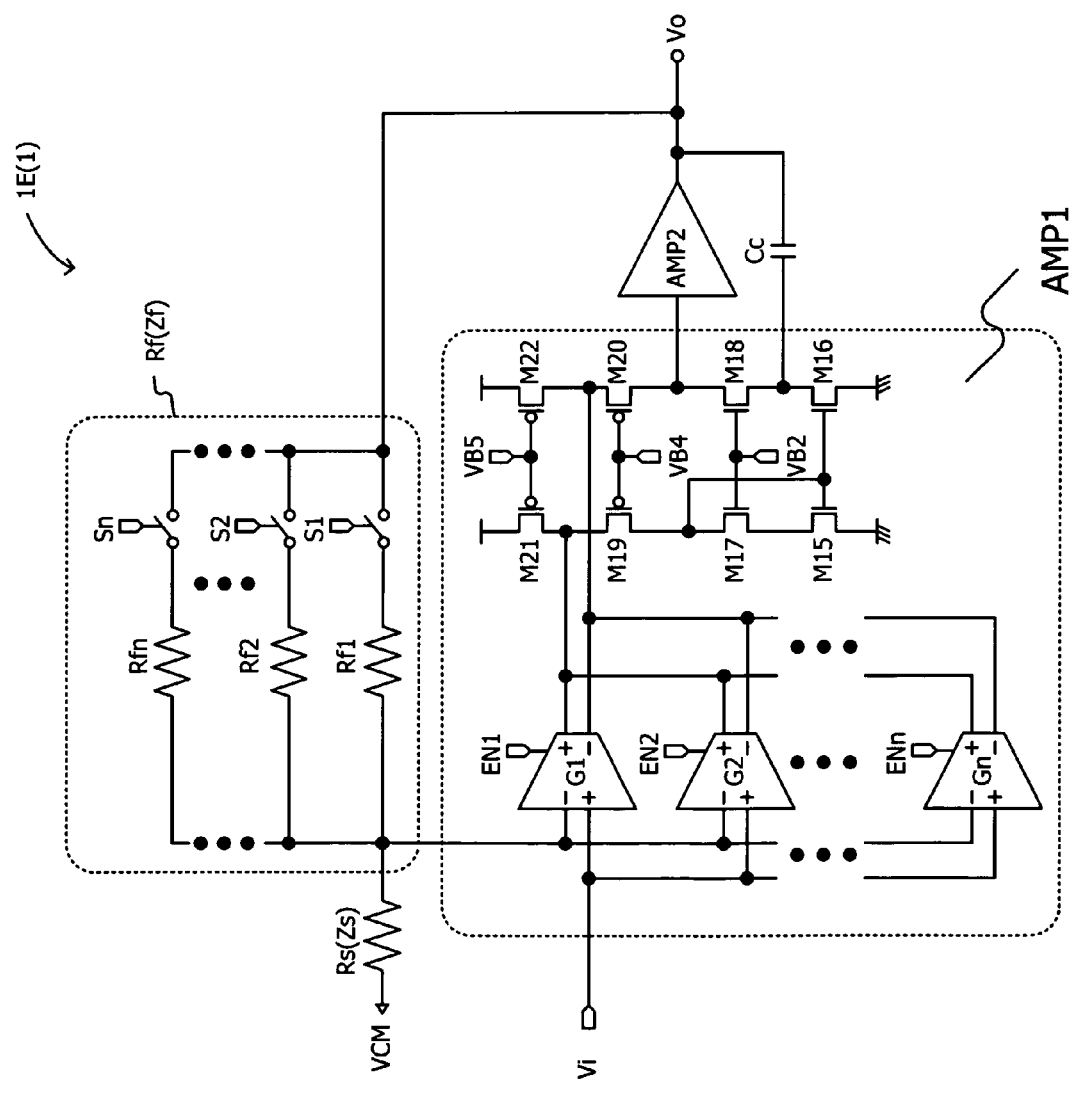
FIG. 10 is a schematic circuit diagram showing a circuit configuration example according to a fifth embodiment in a variable gain circuit according to the present invention.

More specifically, as shown in FIG. 10B, the transconductance cell Gn includes N type MOS transistors M11 and M12 serving as a differential pair circuit, P type MOS transistors M13 and M14 serving as constant current sources to supply a constant current to the differential pair circuit, and an N type MOS transistor M10. In addition, the transconductance cells G1 to Gn have the same configuration. In addition, a reference voltage VB5 is inputted to gate terminals of the P type MOS transistors M13 and M14 through a switch circuit SW that is turned on and off based on an enable signal ENn, and a power supply voltage is inputted thereto through a switch circuit SWb that is turned on and off based on an inversion signal of the enable signal ENn.

According to the N type MOS transistor M10, the power supply voltage or a reference voltage VB1 is inputted to a gate terminal based on the enable signal ENn, and the power supply voltage is inputted to a source terminal, respectively. More specifically, the gate terminal of the N type MOS transistor M10 receives the reference voltage VB1 through the switch circuit SW that is turned on and off based on the enable signal ENn, and receives the power supply voltage through the switch circuit SWb that is turned on and off based on the inversion signal of the enable signal ENn.

In addition, the transconductance of the differential pair circuit of the transconductance cell Gi (i=1 to n) corresponds to transconductance of the transconductance cell Gi (i=1 to n). The transconductance cell Gi (i=1 to n) to which a current is supplied from the constant current sources M10, M13, and M14 based on the setting of the enable signal ENi (i=1 to n), that is, the cell Gi in the active state has a predetermined transconductance value, and the transconductance cell Gi (i=1 to n) to which a current is not supplied from the constant current sources M10, M13, and M14, that is, the cell Gi in the inactive state has the transconductance value of zero.

Figure 10A:
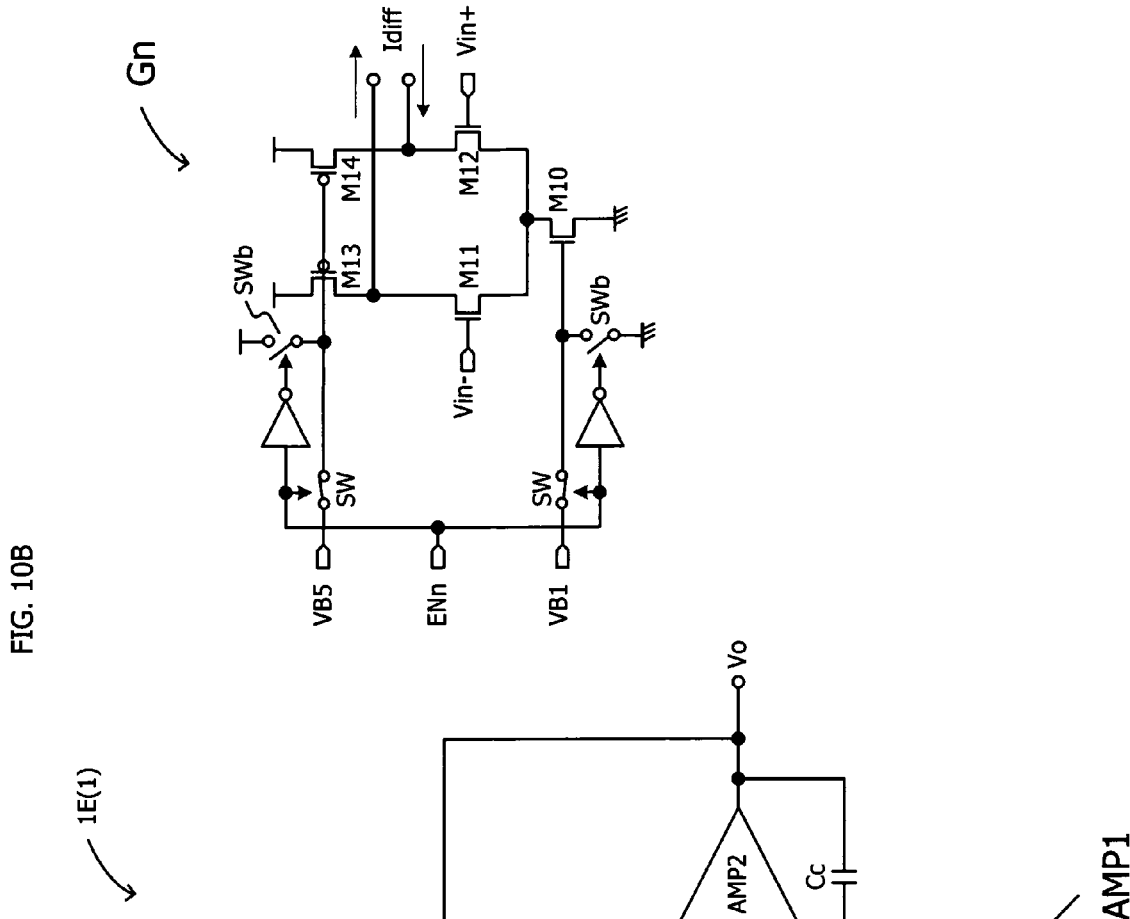

As shown in FIG. 10A, the active load circuit is composed of N type MOS transistors M15 to M18, and P type MOS transistors N19 to M22. In addition, a reference voltage VB2 in FIG. 10A is a reference voltage to be inputted to gate terminals of the N type MOS transistors M17 and M18, and a reference voltage VB4 is a reference voltage to be inputted to gate terminals of the P type MOS transistors M19 and M20, and a reference voltage VB5 is a reference voltage to be inputted to gate terminals of the P type MOS transistors M21 and M22.

Control of the circuit 1E of the present invention according to this embodiment will be described hereinafter.

Similar to the above first to fourth embodiments, as a value of a resistor circuit Rf determined by the connected state of the resistor elements Rfi (i=1 to n) of the gain setting circuit is decreased, a value of a variable gain G is decreased. In addition, according to this embodiment, the number of the transconductance cells G1 to Gn in the active state is decreased, a transconductance value Gm1 of the precedent stage amplifier circuit AMP1 is decreased.

Therefore, according to this embodiment, when the variable gain G is decreased, the connected state is changed so as to decrease the value of the resistor circuit Rf, and accordingly the number of the transconductance cells G1 to Gn in the active state is decreased. In addition, when the variable gain G is increased, the connected state is changed so as to increase the value of the resistor circuit Rf, and accordingly the number of the transconductance cells G1 to Gn in the active state is increased.

According to the above control, the variable gain G can be increased and decreased in the circuit 1E of the present invention while a phase margin PM is kept constant. In addition, when the variable gain G is decreased, since the number of the transconductance cells G1 to Gn in the active state is decreased, that is, the number of transconductance cells G1 to Gn to which a current is supplied is decreased, a current consumption can be lowered.

Sixth Embodiment

A sixth embodiment of a circuit of the present invention will be described with reference to FIG. 11. In addition, in this embodiment, a description will be made of a case where a configuration of a transconductance cell of a precedent stage amplifier circuit AMP1 is different from that in the fifth embodiment.

Figure 11:
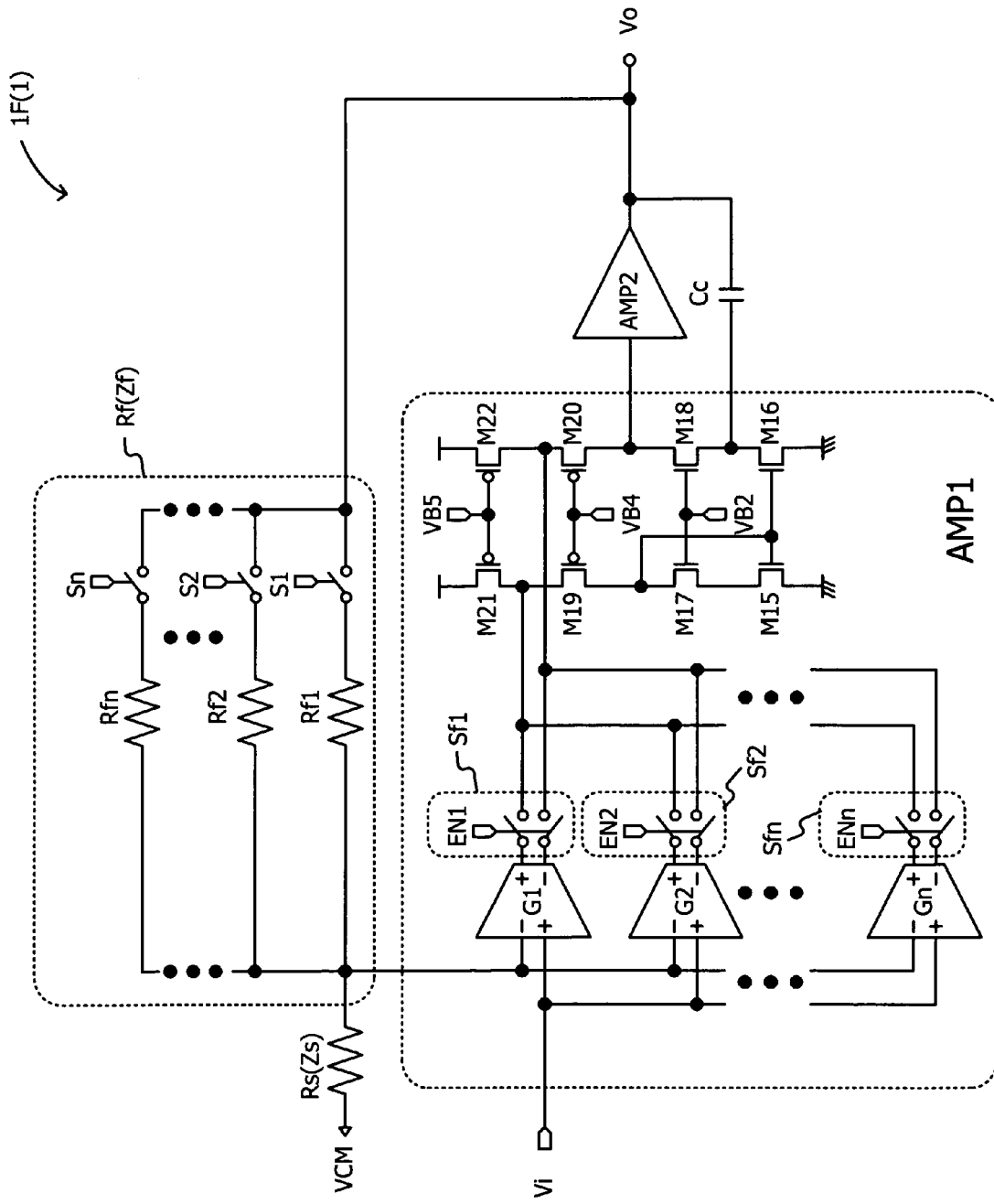
FIG. 11 is a schematic circuit diagram showing a circuit configuration example according to a sixth embodiment in a variable gain circuit according to the present invention.

Here, FIG. 11 shows a schematic configuration of the circuit of the present invention according to this embodiment. As shown in FIG. 11, a circuit 1F of the present invention according to this embodiment includes the precedent stage amplifier circuit AMP1 to amplify an external input signal Vi, a subsequent stage amplifier circuit AMP2 to amplify an output signal of the precedent stage amplifier circuit AMP1, a phase compensation circuit having a fixed capacitative element Cc and connected between an output terminal and an input terminal of the subsequent stage amplifier circuit AMP2, and a gain setting circuit adapted to be capable of setting a gain value of the whole of the precedent stage amplifier circuit AMP1 and the subsequent stage amplifier circuit AMP2 to a plurality of values, in which one of the gain value and a transconductance value of the precedent stage amplifier circuit AMP1 can be set in conjunction with the other. In addition, the configurations of the subsequent stage amplifier circuit AMP2, the phase compensation circuit, and the gain setting circuit are the same as those in the first to fifth embodiments.

The precedent stage amplifier circuit AMP1 according to this embodiment includes an amplifier, and the amplifier includes transconductance cells G1 to Gn composed of a differential pair circuit and a second current supply circuit to supply a current to the differential pair circuit, and an active load circuit to which an output current of the transconductance cells G1 to Gn is inputted, in which output terminal of the transconductance cell Gi (i=1 to n) is connected to the active load circuit through a second switch circuit Sfi (i=1 to n), and a certain number of second switch circuits Sfi (i=1 to n) determined based on a set gain value G are turned on and the other second switch circuits Sfi (i=1 to n) are turned off. In addition, the configurations of the transconductance cells and the active load circuit are the same as those in the fifth embodiment.

Control of the circuit 1F of the present invention according to this embodiment will be described hereinafter.

Similar to the above first to fifth embodiments, as a value of a resistor circuit Rf determined by the connected state of resistor elements Rfi (i=1 to n) of the gain setting circuit is decreased, the value of the variable gain G is decreased. In addition, according to this embodiment, the number of the transconductance cells G1 to Gn connected to the active load circuit is decreased, a transconductance value Gm1 of the precedent stage amplifier circuit AMP1 is decreased.

Therefore, according to this embodiment, when the variable gain G is decreased, the connected state is changed so as to decrease the value of the resistor circuit Rf, and accordingly the switch circuit Sfi (i=1 to n) is controlled and the number of the transconductance cells Gi (i=1 to n) connected to the active load circuit is decreased. In addition, when the variable gain G is increased, the connected state is changed so as to increase the value of the resistor circuit Rf, and accordingly the switch circuit Sfi (=1 to n) is controlled and the number of the transconductance cells Gi (i=1 to n) connected to the active load circuit is increased.

According to the above control, the variable gain G can be increased and decreased in the circuit 1F of the present invention with the simple configuration while a phase margin PM is kept constant.

Seventh Embodiment

A seventh embodiment of a circuit of the present invention will be described with reference to FIG. 12. In addition, in this embodiment, a description will be made of a case where a configuration of a transconductance cell of a precedent stage amplifier circuit AMP1 is different from those in the fifth and sixth embodiments.

Figure 12:
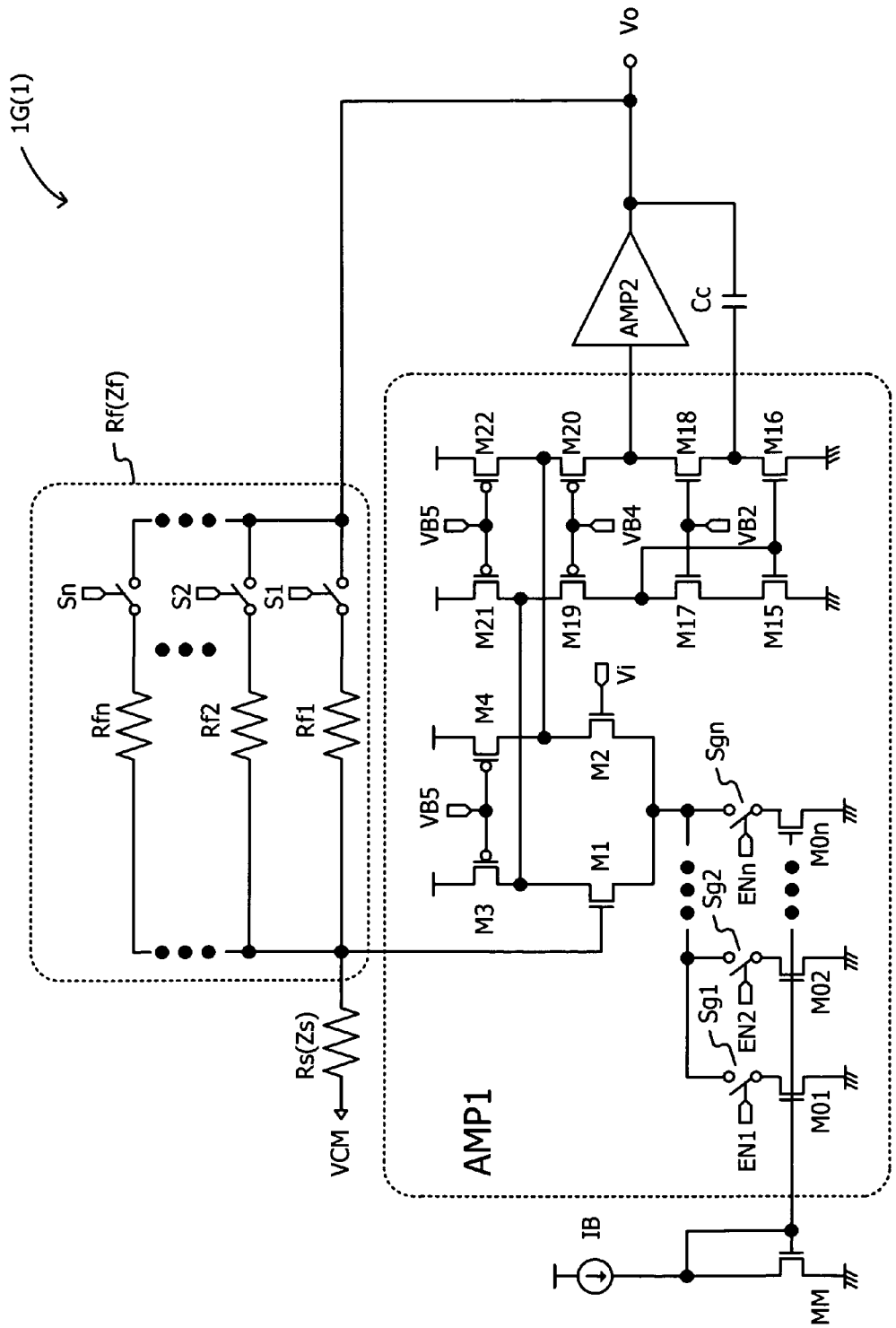
FIG. 12 is a schematic circuit diagram showing a circuit configuration example according to a seventh embodiment in a variable gain circuit according to the present invention.

Here, FIG. 12 shows a schematic configuration of the circuit of the present invention according to this embodiment. As shown in FIG. 12, a circuit 1G of the present invention according to this embodiment includes the precedent stage amplifier circuit AMP1 to amplify an external input signal Vi, a subsequent stage amplifier circuit AMP2 to amplify an output signal of the precedent stage amplifier circuit AMP1, a phase compensation circuit having a fixed capacitative element Cc and connected between an output terminal and an input terminal of the subsequent stage amplifier circuit AMP2, and a gain setting circuit adapted to be capable of setting a gain value of the whole of the precedent stage amplifier circuit AMP1 and the subsequent stage amplifier circuit AMP2 to a plurality of values, in which one of the gain value and a transconductance value of the precedent stage amplifier circuit AMP1 can be set in conjunction with the other. In addition, the configurations of the subsequent stage amplifier circuit AMP2, the phase compensation circuit, and the gain setting circuit are the same as those in the first to sixth embodiments.

The precedent stage amplifier circuit AMP1 according to this embodiment includes an amplifier, and the amplifier includes a transconductance cell composed of a differential pair circuit and a third current supply circuit to supply a current to the differential pair circuit, and an active load circuit to which an output current of the transconductance cell is inputted, in which the third current supply circuit sets a current value to be supplied to the amplifier based on the set gain value. In addition, the configuration of the active load circuit is the same as those in the fifth and sixth embodiments.

As shown in FIG. 12, the transconductance cell according to this embodiment includes N type MOS transistors M1 and M2, P type MOS transistors M3 and M4, and N type MOS transistors M01 to M0n serving as the third current supply circuit. In addition, a reference voltage VB2 in FIG. 12 is a reference voltage to be inputted to gate terminals of the N type MOS transistors M17 and M18, and a reference variable gain VB4 is a reference voltage to be inputted to gate terminals of the P type MOS transistors M19 and M20, and a reference variable gain VB5 is a reference voltage to be inputted to gate terminals of the P type MOS transistors M21, M22, M3, and M4.

The N type MOS transistor M0i (i=1 to n) in the third current supply circuit of the transconductance cell form a current mirror circuit with an N type MOS transistor MM to which a current is supplied from a constant current source IB. According to the N type MOS transistor MM, its gate terminal and drain terminal are connected to the constant current source IB, and its source terminal is grounded. According to the N type MOS transistor M0i (i=1 to n), its gate terminal is connected to the gate terminal and the drain terminal of the N type MOS transistor MM, its drain terminal is connected to a switch circuit Sgi (i=1 to n), respectively, and its source terminal is grounded. The switch circuit Sgi (i=1 to n) is turned on and off based on an enable signal ENi (i=1 to n).

Control of the circuit 1G of the present invention according to this embodiment will be described hereinafter.

Similar to the above first to sixth embodiments, as a value of a resistor circuit Rf determined by the connected state of resistor elements Rfi (i=1 to n) is decreased, a value of a variable gain G is decreased. In addition, since the amplifier of the precedent stage amplifier circuit AMP1 is composed of the MOS transistors, as shown in the formula 19, as a drain current Ids of the N type MOS transistors M1 and M2 serving as the differential pair circuit is decreased, a transconductance value Gm1 of the precedent stage amplifier circuit AMP1 is decreased.

Therefore, according to this embodiment, when the variable gain G is decreased, the connected state is changed so as to decrease the value of the resistor circuit Rf, and accordingly the switch circuit Sgi (i=1 to n) is controlled and a current amount of the drain current of the N type MOS transistors M1 and M2 serving as the differential pair circuit is decreased. In addition, when the variable gain G is increased, the connected state is changed so as to increase the value of the resistor circuit Rf, and accordingly the switch circuit Sgi (i=1 to n) is controlled and the current amount of the drain current of the N type MOS transistors M1 and M2 is increased.

According to the above control, the variable gain G can be increased and decreased in the circuit 1G of the present invention while a phase margin PM is kept constant. In addition, when the variable gain G is decreased, since the current amount supplied to the transconductance cell is decreased, a current consumption can be lowered.

Eighth Embodiment

An eighth embodiment of a circuit of the present invention will be described with reference to FIG. 13. In addition, in this embodiment, a description will be made of a case where a configuration of a precedent stage amplifier circuit AMP1 is different from those in the first to seventh embodiments.

Figure 13:
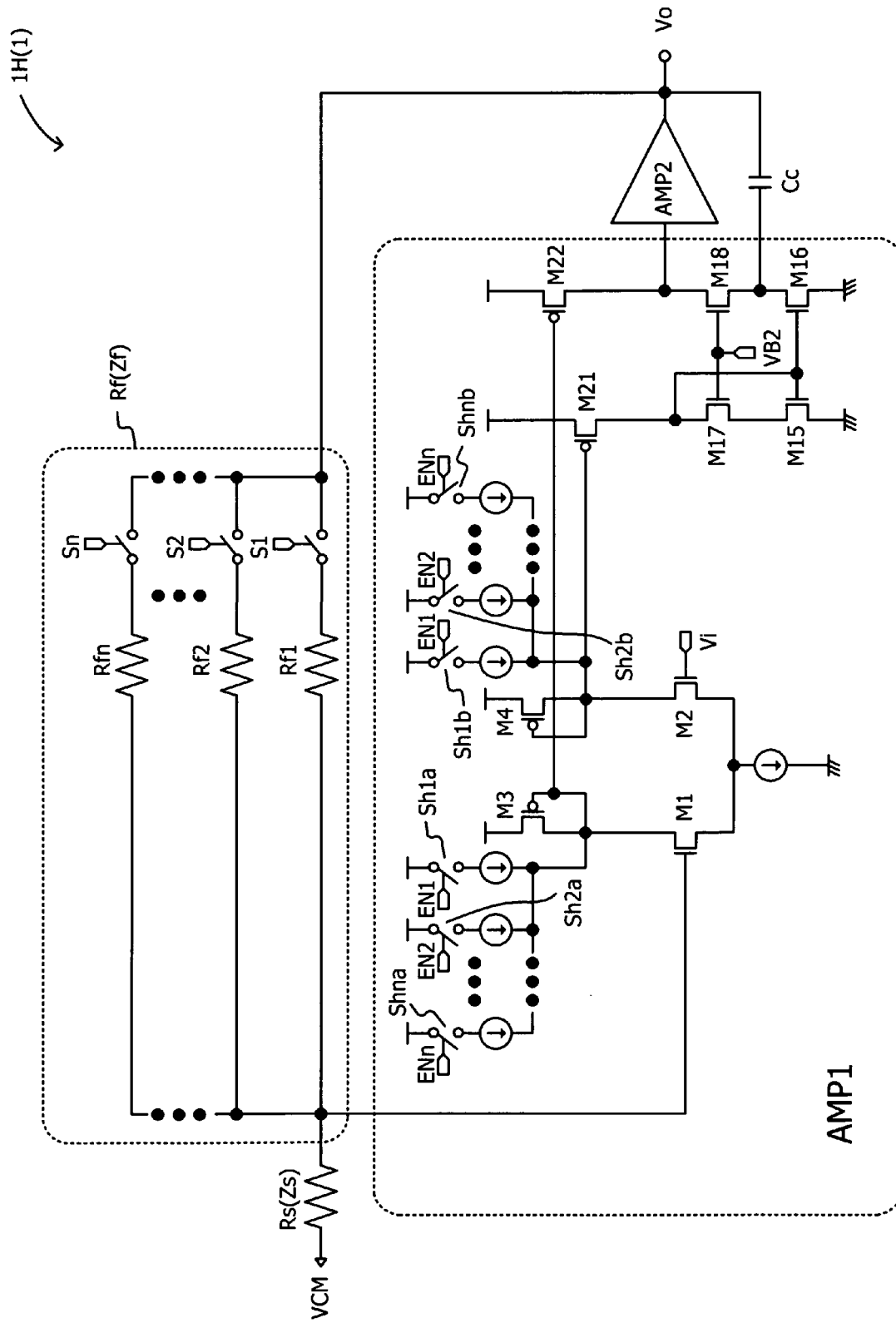
FIG. 13 is a schematic circuit diagram showing a circuit configuration example according to an eighth embodiment in a variable gain circuit according to the present invention.

Here, FIG. 13 shows a schematic configuration of the circuit of the present invention according to this embodiment. As shown in FIG. 13, a circuit 1H of the present invention according to this embodiment includes the precedent stage amplifier circuit AMP1 to amplify an external input signal Vi, a subsequent stage amplifier circuit AMP2 to amplify an output signal of the precedent stage amplifier circuit AMP1, a phase compensation circuit having a fixed capacitative element Cc and connected between an output terminal and an input terminal of the subsequent stage amplifier circuit AMP2, and a gain setting circuit adapted to be capable of setting a gain value of the whole of the precedent stage amplifier circuit AMP1 and the subsequent stage amplifier circuit AMP2 to a plurality of values, in which one of the gain value and a transconductance value of the precedent stage amplifier circuit AMP1 can be set in conjunction with the other. In addition, the configurations of the subsequent stage amplifier circuit AMP2, the phase compensation circuit, and the gain setting circuit are the same as those in the first to seventh embodiments.

The precedent stage amplifier circuit AMP1 according to this embodiment includes a current mirror amplifier including a current mirror circuit and a fourth current supply circuit to supply a current to the current mirror circuit, in which the fourth current supply circuit sets a current amount to be supplied to the current mirror circuit based on the set gain value, so that a current mirror ratio of the current mirror circuit is set.

As shown in FIG. 13, the current mirror amplifier circuit is composed of N type MOS transistors M1, M2, M15 to M18, and P type MOS transistors M3, M4, M21, and M22. In addition, a reference voltage VB2 in FIG. 13 is a reference voltage to be inputted to gate terminals of the N type MOS transistors M17 and M18.

The fourth current supply circuit is configured such that a predetermined amount of current is supplied to a drain terminal of the P type MOS transistor M3 through a switch circuit Shia (i=1 to n), so that the current whose amount is determined based on the number of the on-state switch circuits Shia (i=1 to n) is supplied to the drain terminal of the P type MOS transistor M3. Furthermore, the fourth current supply circuit is configured such that a predetermined amount of current is supplied to a drain terminal of the P type MOS transistor M4 through a switch circuit Shib (i=1 to n), so that the current whose amount is determined based on the number of the on-state switch circuits Shib (i=1 to n) is supplied to a drain terminal of the P type MOS transistor M4.

Control of the circuit 1H of the present invention according to this embodiment will be described hereinafter.

Similar to the above first to seventh embodiments, as a value of a resistor circuit Rf determined by a connected state of resistor elements Rfi (i=1 to n) of the gain setting circuit is decreased, a value of a variable gain G is decreased. In addition, according to this embodiment, the current amount supplied to the current mirror amplifier circuit is decreased, a transconductance value Gm1 of the precedent stage amplifier circuit AMP1 is decreased.

Therefore, according to this embodiment, when the variable gain G is decreased, the connected state is changed so as to decrease the value of the resistor circuit Rf, and accordingly the switch circuit Shia and the switch circuit Shib are controlled and the current amount to be supplied to the current mirror amplifier circuit is decreased. In addition, when the variable gain G is increased, the connected state is changed so as to increase the value of the resistor circuit Rf, and accordingly the switch circuit Shia and switch circuit Shib are controlled and the current amount to be supplied to the current mirror amplifier circuit is increased.

According to the above control, the variable gain G can be increased and decreased in the circuit 1H of the present invention with the simple configuration while a phase margin PM is kept constant.

Figure 14:
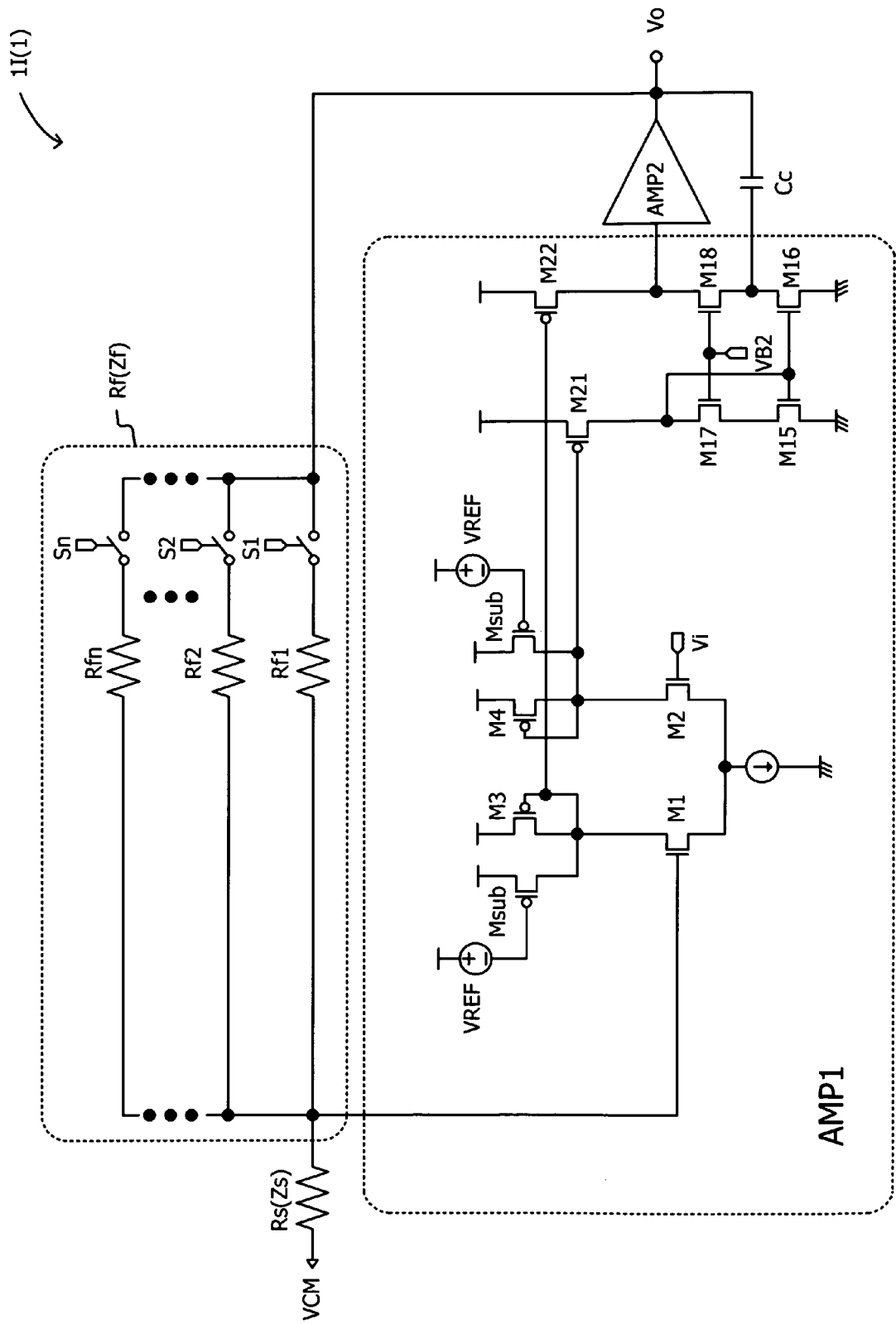
FIG. 14 is a schematic circuit diagram showing a circuit configuration example according to a variation of the eighth embodiment in the variable gain circuit according to the present invention.

In addition, FIG. 14 is a variation of this embodiment.

A fourth current supply circuit of a precedent stage amplifier circuit AMP1 shown in FIG. 14 is composed of a voltage source VREF capable of changing a supply current value, and a P type MOS transistor Msub. According to the fourth current supply circuit, the voltage source VREF is connected to a gate terminal of the P type MOS transistor Msub, and a current whose amount is determined based on a voltage value of the voltage source VREF is supplied to a drain terminal of a P type MOS transistor M3.

According to a circuit 1I of the present invention shown in FIG. 14, when a variable gain G is decreased, the connected state is changed so as to decrease a value of a resistor circuit Rf, and accordingly the current source VREF is controlled and the current amount to be supplied to a current mirror amplifier circuit is decreased. In addition, when the variable gain G is increased, the connected state is changed so as to increase the value of the resistor circuit Rf, and accordingly the current supply VREF is controlled and the current amount to be supplied to the current mirror amplifier circuit is increased. According to the above configuration, the same effect as in the circuit 1H of the present invention is achieved in the circuit 1I of the present invention.

Figure 15:
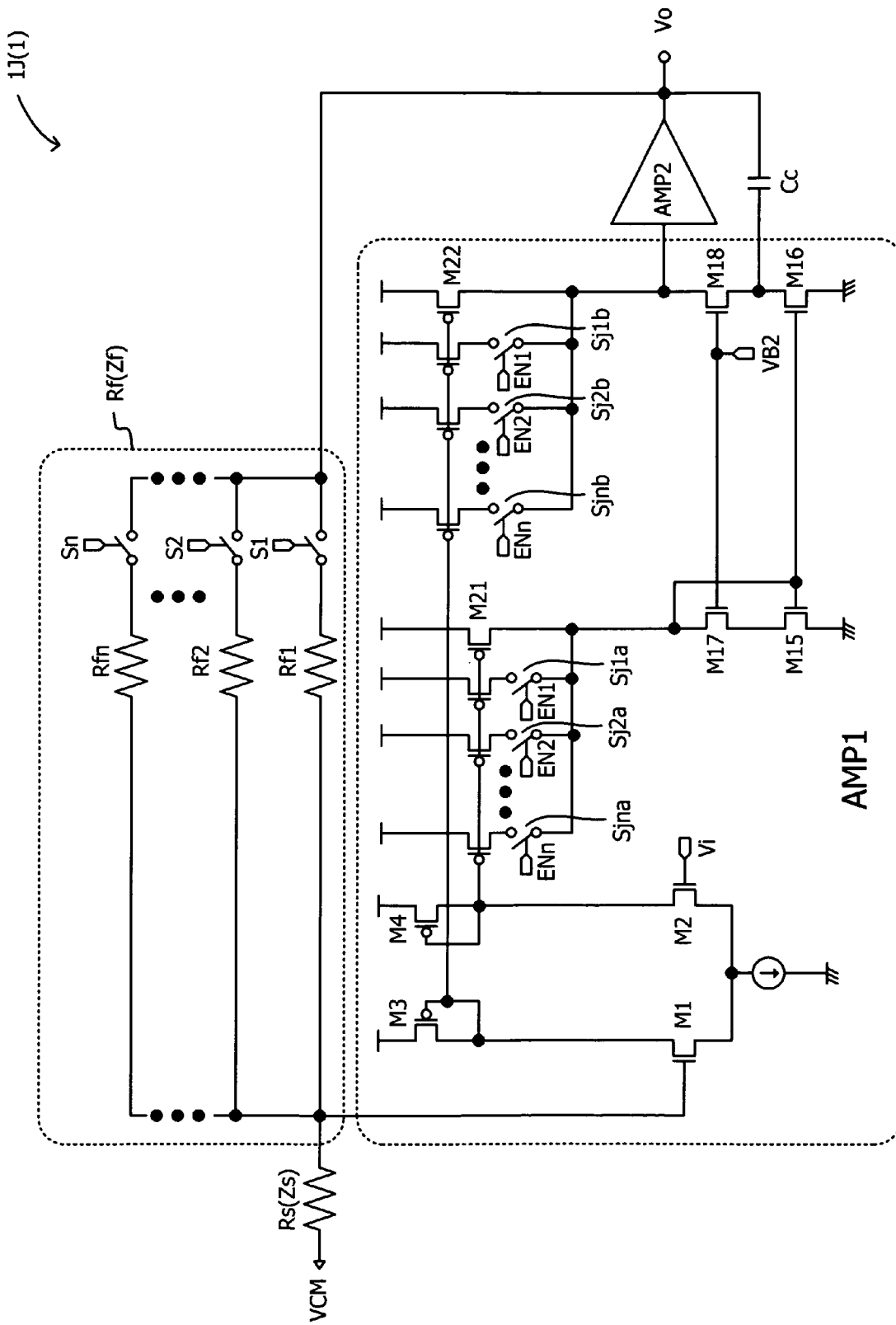
FIG. 15 is a schematic circuit diagram showing a circuit configuration example according to a variation of the eighth embodiment in the variable gain circuit according to the present invention.

In addition, FIG. 15 is another variation of this embodiment.

A fourth current supply circuit of a precedent stage amplifier circuit AMP1 shown in FIG. 15 is composed of a plurality of series circuits each having a switch circuit Sjia (i=1 to n) and a P type MOS transistor, in which a current is supplied to a drain terminal of a P type MOS transistor M21. Furthermore, the fourth current supply circuit is composed of a plurality of series circuits each having a switch circuit Sjib (i=1 to n) and a P type MOS transistor, in which a current is supplied to a drain terminal of a P type MOS transistor M22.

According to a circuit 1J of the present invention shown in FIG. 15, when a variable gain G is decreased, the connected state is changed so as to decrease a value of a resistor circuit Rf, and accordingly the switch circuits Shia and Shib are controlled to decrease the number of the on-state signal circuits Shia and Shib, and a current amount to be supplied to a current mirror amplifier circuit is decreased. In addition, when the variable gain G is increased, the connected state is changed so as to increase the value of the resistor circuit Rf, and accordingly the switch circuits Shia and Shib are controlled to increase the number of the on-state signal circuits Shia and Shib, and a current amount to be supplied to the current mirror amplifier circuit is increased. According to the above configuration, the same effect as in the circuit 1H of the present invention is achieved in the circuit 1J of the present invention.

Ninth Embodiment

A ninth embodiment of a circuit of the present invention will be described with reference to FIG. 16.

Figure 16:
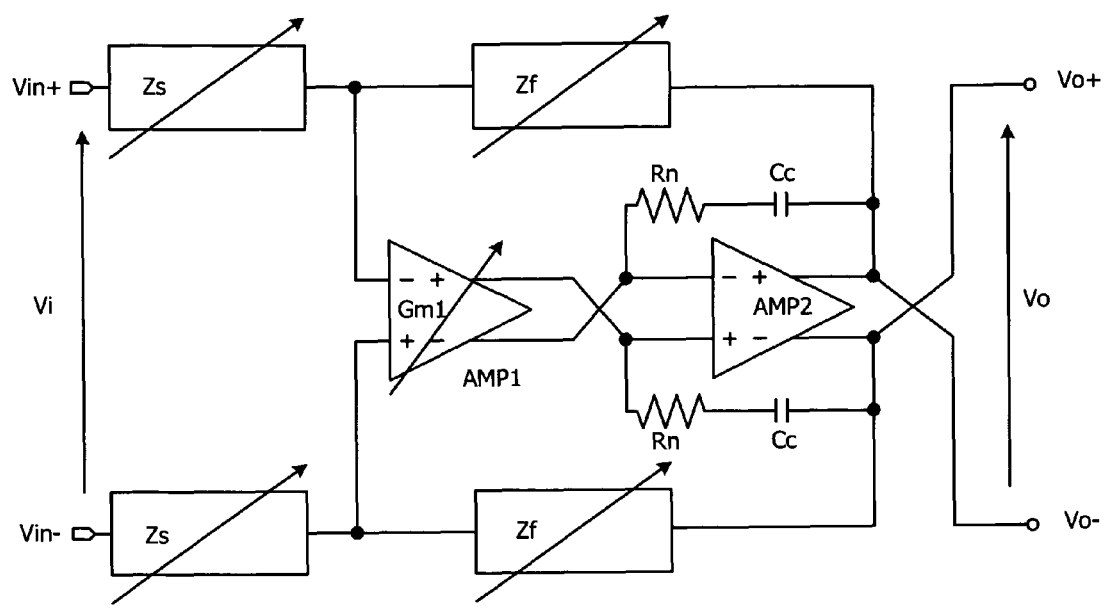
FIG. 16 is a schematic circuit diagram showing a circuit configuration example according to a ninth embodiment in a variable gain circuit according to the present invention.

Here, FIG. 16 shows a configuration of the circuit of the present invention in this embodiment. According to the circuit of the present invention in this embodiment, a positive side input terminal of a first stage amplifier is fully differentiated from a negative side input terminal thereof.

A circuit 1 of the present invention shown in FIG. 16 includes a precedent stage amplifier circuit AMP1 to amplify an external input signal Vi, a subsequent stage amplifier circuit AMP2 to amplify an output signal of the precedent stage amplifier circuit AMP1, a phase compensation circuit composed of two series circuits each having a resistor element Rn and a capacitor Cc, and a gain setting circuit composed of two series circuits each having load impedances Zs and Zf. In addition, the configuration of the precedent stage amplifier circuit AMP1 is the same as any one of the above first to eighth embodiments, and a fully differential configuration.

According to the circuit 1 of the present invention shown in FIG. 16, a positive side output terminal of the precedent stage amplifier circuit AMP1 is connected to a positive side input terminal of the subsequent stage amplifier circuit AMP2, and a negative side output terminal of the precedent stage amplifier circuit AMP1 is connected to a negative side input terminal of the subsequent stage amplifier circuit AMP2. In addition, one series circuit of the phase compensation circuit is connected between a positive side output terminal and the negative side input terminal of the subsequent stage amplifier circuit AMP2, and the other series circuit of the phase compensation circuit is connected between a negative side output terminal and the positive side input terminal of the subsequent stage amplifier circuit AMP2. In addition, the load impedance Zf of the one series circuit of the gain setting circuit is connected between the positive side output terminal of the subsequent stage amplifier circuit AMP2 and the negative side input terminal of the precedent stage amplifier circuit AMP1, and the load impedance Zf of the other series circuit of the gain setting circuit is connected between the negative side output terminal of the subsequent stage amplifier circuit AMP2 and the positive side input terminal of the precedent stage amplifier circuit AMP1

According to the circuit of the present invention in this embodiment, one of the load impedances Zs and Zf, or both of the load impedances Zs and Zf are fluctuated at the same time, to fluctuate a variable gain G. When the variable gain G is decreased, a transconductance value of the first stage amplifier circuit is controlled so as to be decreased accordingly, and when the variable gain G is increased, the transconductance value of the first stage amplifier circuit is controlled so as to be increased accordingly.

Tenth Embodiment

A tenth embodiment of a system of the present invention will be described with reference to FIG. 17.

Figure 17:
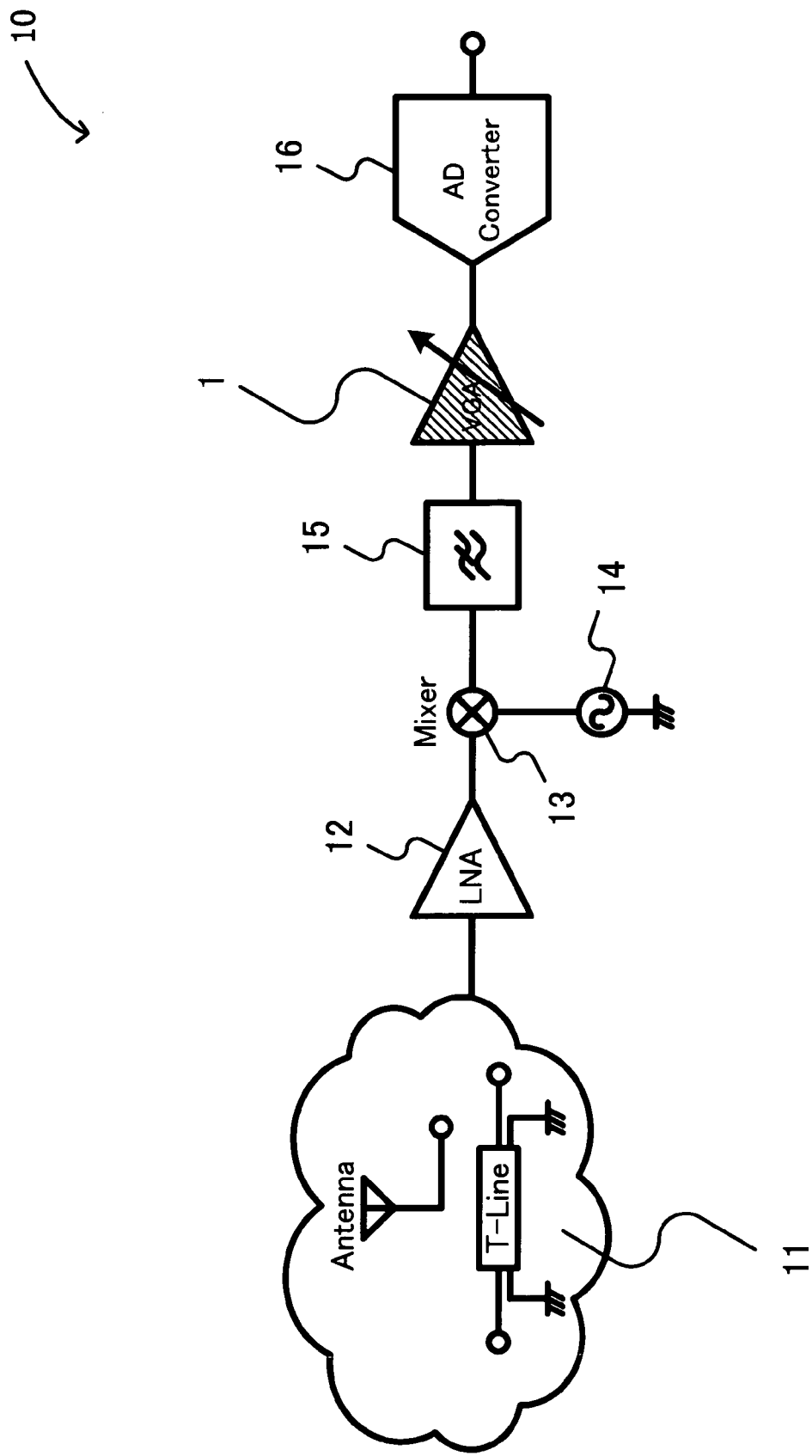
FIG. 17 is a schematic circuit diagram showing a circuit configuration example of a signal processing system according to the present invention.

Here, FIG. 17 shows a schematic configuration of a communication system 10 (signal processing system) composed of the circuit 1 of the present invention according to any one of the above first to ninth embodiments.

The communication system 10 includes a communication path 11, a LNA (Low Noise Amplifier) 12, a mixer 13, a local oscillator 14, a filter circuit 15, the circuit 1 of the present invention, and an AD converter 16, in which a received signal is optionally amplified.

In addition, the communication path 11 may be wireless or wired. In addition, a communication may be any type such as an electromagnetic coupling type or optical type. When the circuit 1 of the present invention is used, a circuit area can be miniaturized, and power consumption can be lowered.

Eleventh Embodiment

An eleventh embodiment of a system of the present invention will be described with reference to FIG. 18.

Figure 18:
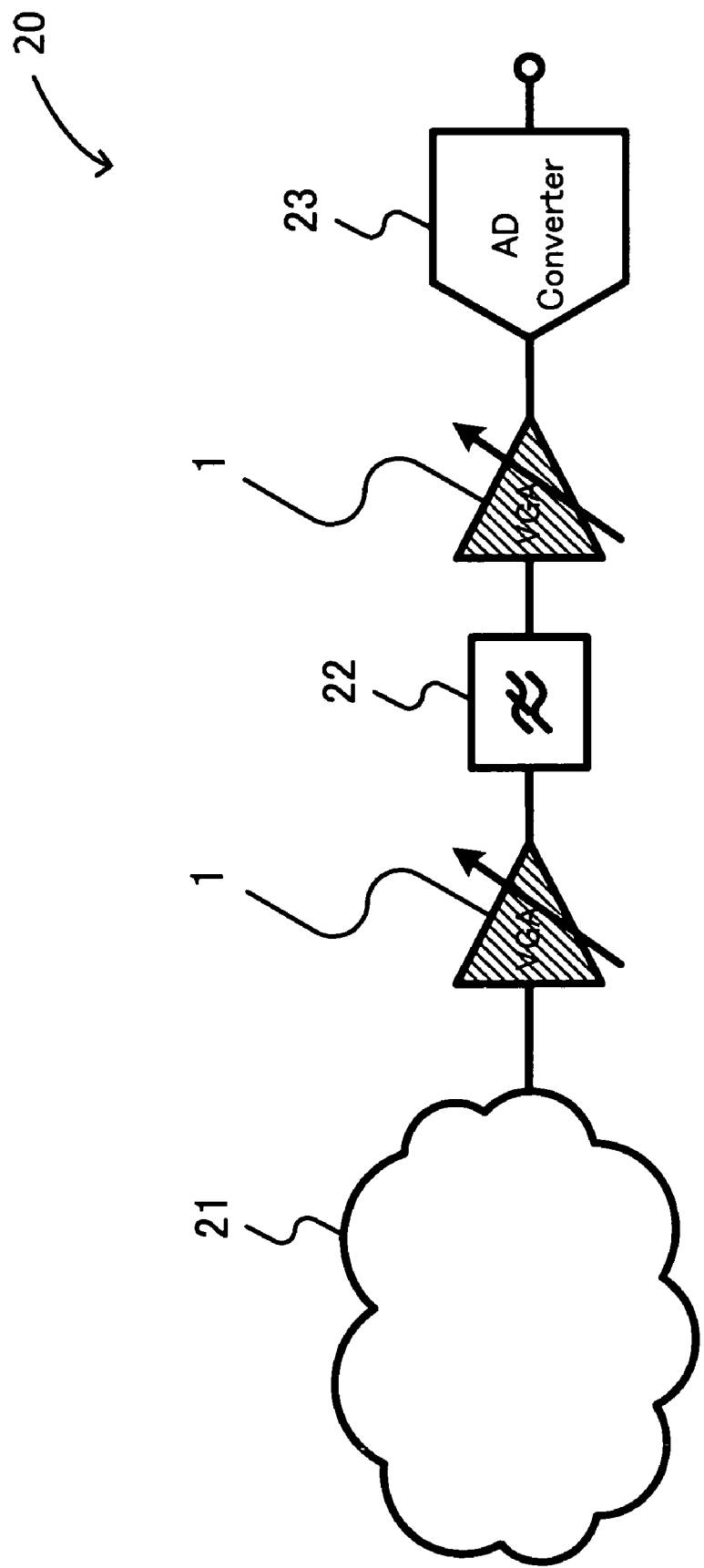
FIG. 18 is a schematic circuit diagram showing a circuit configuration example of a signal processing system according to the present invention.
Figure 19:
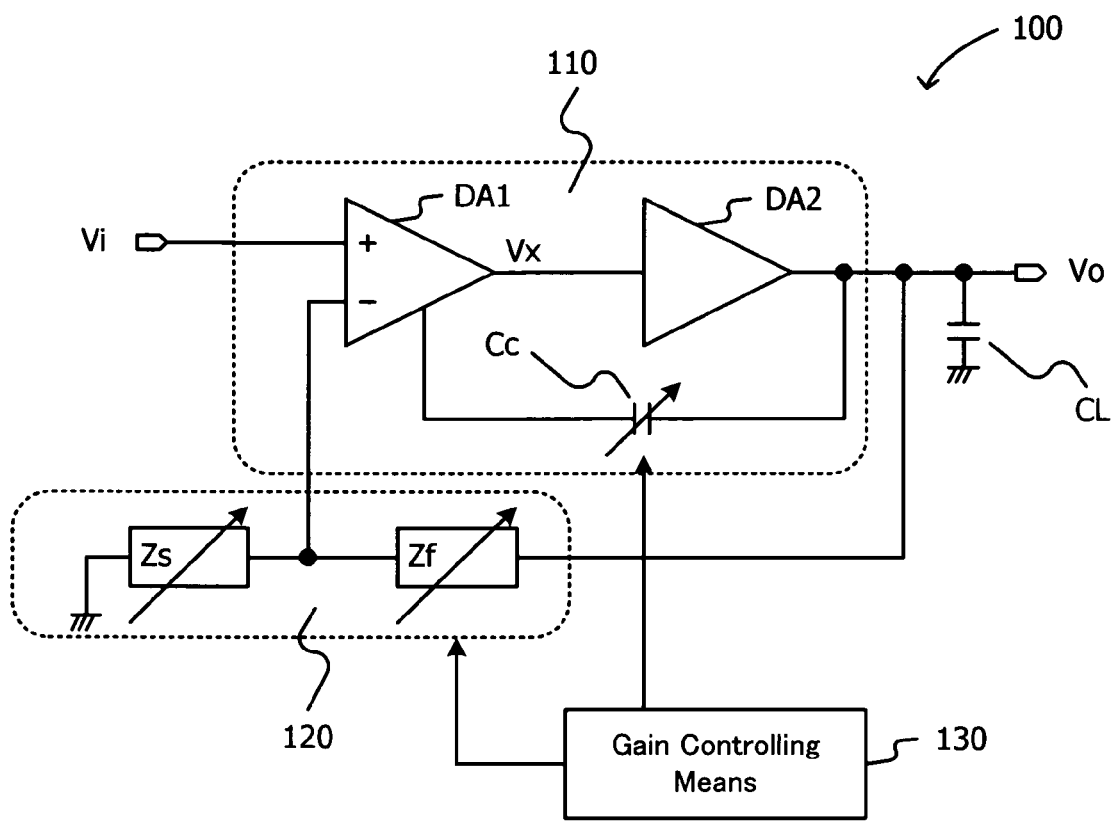
FIG. 19 is a schematic block diagram showing a schematic configuration example of a variable gain circuit according to a conventional technique.
Figure 20:
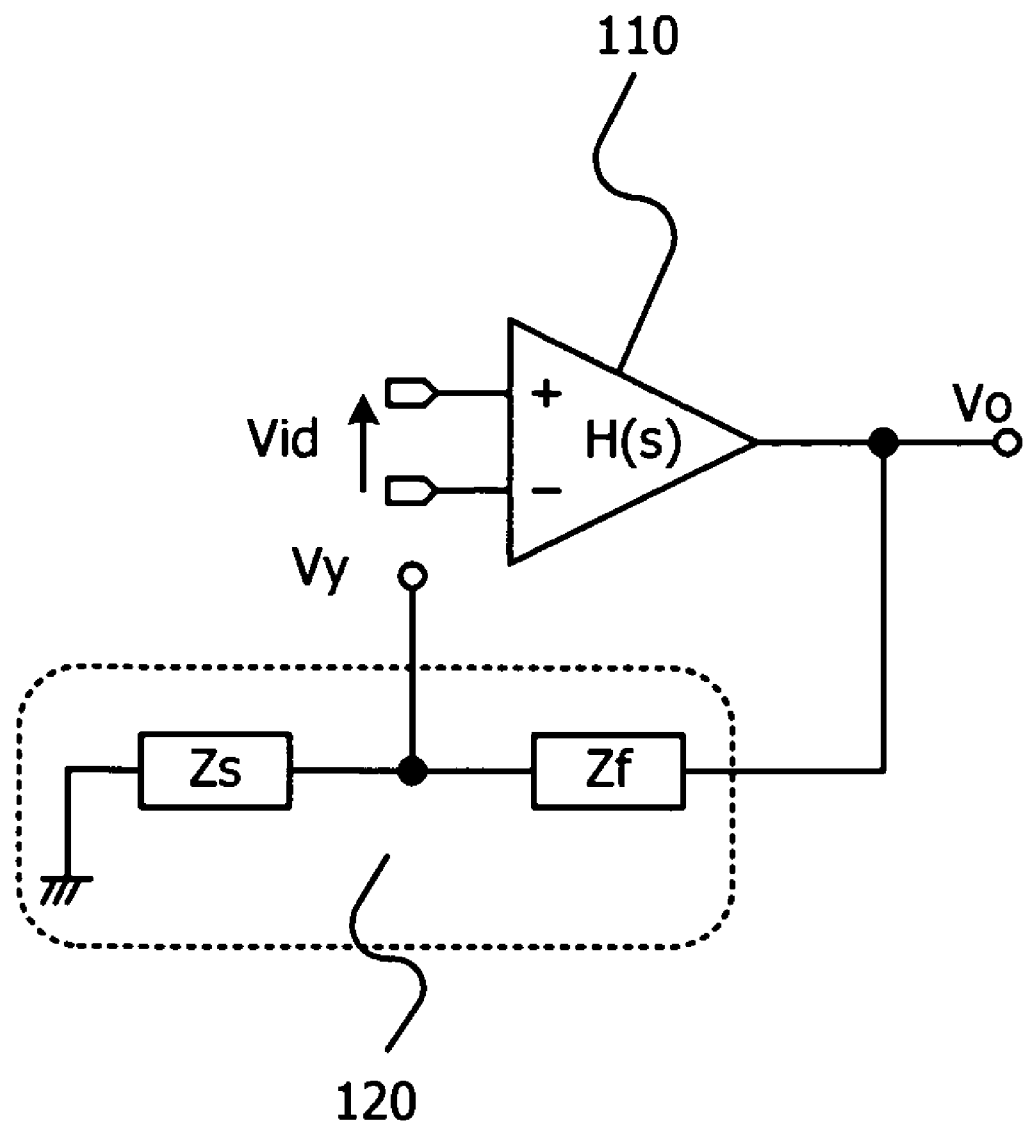
FIG. 20 is an explanation view to calculate an open-loop transfer function in the variable gain circuit according to the conventional technique.
Figure 21A:
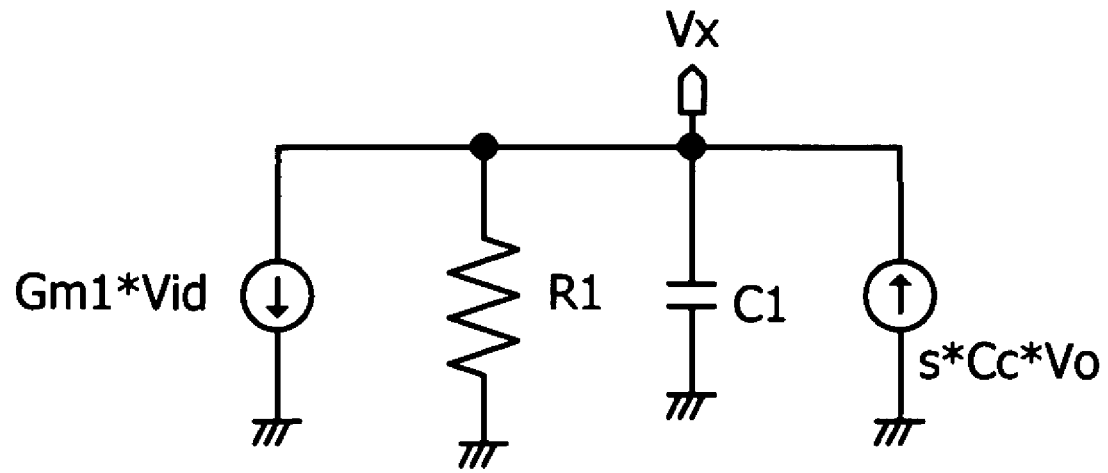
FIG. 21 is a circuit diagram showing equivalent circuits of amplifiers in a two-stage amplifiers of the variable gain circuit according to the conventional technique.
Figure 21B:
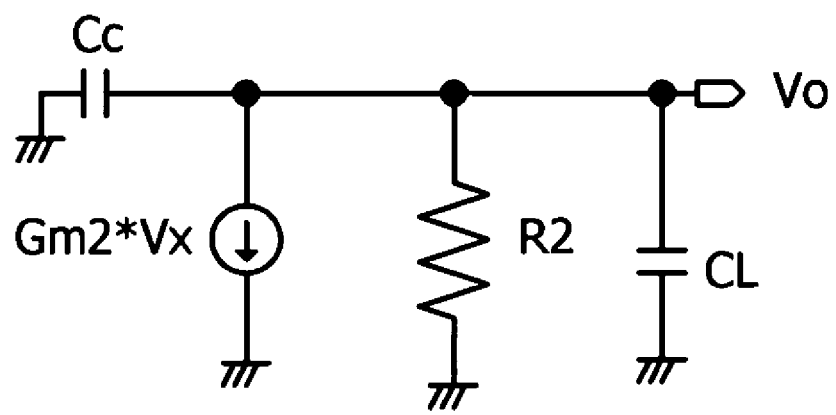

Here, FIG. 18 shows a schematic configuration of a sensor system 20 (signal processing system) composed of the circuit 1 of the present invention according to any one of the above first to ninth embodiments.

The sensor system 20 includes a series circuit composed of a physical quantity measuring sensor 21, the circuit 1 of the present invention, an anti-aliasing filter 22, the circuit 1 of the present invention, and an AD converter 23, in which a signal detected by the physical quantity measuring sensor 21 is optionally amplified or attenuated.

In addition, the physical quantity measuring sensor 21 can measure any target object. When the sensor system 20 uses the circuit 1 of the present invention, a circuit area can be miniaturized and power consumption can be lowered.

Other Embodiments (1) Although the resistance value of the resistor circuit Rf (value of the load impedance Zf) is changed when the variable gain G is changed in the above first to ninth embodiments, the resistance value of the resistor element Rs (value of the load impedance Zs) may be changed instead.
(2) Although the descriptions have been made of the case where the phase compensation circuit is provided in the above first to ninth embodiments, when a conductance value of the subsequent stage amplifier circuit AMP2 is sufficiently great and there is no need to provide the phase compensation circuit, the phase compensation circuit may not be provided.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A variable gain circuit comprising:
   a precedent stage amplifier circuit for amplifying an external input signal;
   a subsequent stage amplifier circuit for amplifying an output signal of the precedent stage amplifier circuit; and
   a gain setting circuit adapted to be capable of setting a gain value of a whole of the precedent stage amplifier circuit and the subsequent stage amplifier circuit to a plurality of values, wherein
   the variable gain circuit is configured so that one of the gain value and a transconductance value of the precedent stage amplifier circuit can be set in conjunction with the other, and the precedent stage amplifier circuit sets the transconductance value to be smaller as the gain value is decreased.

2. The variable gain circuit according to claim 1, wherein the precedent stage amplifier circuit includes a plurality of amplifiers, and respective output terminals of the amplifiers are connected to an input terminal of the subsequent stage amplifier circuit, and a number of the amplifiers determined based on the set gain value are made active.

3. The variable gain circuit according to claim 1, wherein the precedent stage amplifier circuit includes a plurality of amplifiers, respective output terminals of the amplifiers are connected to an input terminal of the subsequent stage amplifier circuit through corresponding first switch circuits, and a number of the first switch circuits determined based on the set gain value are turned on and the other first switch circuits are turned off.

4. The variable gain circuit according to claim 1, wherein the precedent stage amplifier circuit includes an amplifier and a first current supply circuit for supplying a current to the amplifier, and
the first current supply circuit sets a current value to be supplied to the amplifier based on the set gain value.

5. The variable gain circuit according to claim 1, wherein the precedent stage amplifier circuit includes an amplifier, the amplifier includes a plurality of transconductance cells each having a differential pair circuit and a second current supply circuit for supplying a current to the differential pair circuit, and an active load circuit to which an output current of the transconductance cells is inputted, and
a number of the transconductance cells determined based on the set gain value are made active.

6. The variable gain circuit according to claim 1, wherein the precedent stage amplifier circuit includes an amplifier, the amplifier includes a plurality of transconductance cells each having a differential pair circuit and a second current supply circuit for supplying a current to the differential pair circuit, and an active load circuit to which an output current of the transconductance cells is inputted, respective output terminals of the transconductance cells are connected to the active load circuit through corresponding second switch circuits, and a number of the second switch circuits determined based on the set gain value are turned on and the other second switch circuits are turned off.

7. The variable gain circuit according to claim 1, wherein
the precedent stage amplifier circuit includes an amplifier,
the amplifier includes a transconductance cell having a differential pair circuit and a third current supply circuit for supplying a current to the differential pair circuit, and an active load circuit to which an output current of the transconductance cell is inputted, and
the third current supply circuit sets a current value to be supplied to the amplifier based on the set gain value.

8. The variable gain circuit according to claim 1, wherein
the precedent stage amplifier circuit includes a current mirror amplifier having a current mirror circuit and a fourth current supply circuit for supplying a current to the current mirror circuit, and
the fourth current supply circuit sets a current amount to be supplied to the current mirror circuit based on the set gain value, whereby a current mirror ratio of the current mirror circuit is set.

9. A signal processing system comprising a variable gain circuit, wherein
the variable gain circuit comprises:
a precedent stage amplifier circuit for amplifying an external input signal;
a subsequent stage amplifier circuit for amplifying an output signal of the precedent stage amplifier circuit; and
a gain setting circuit adapted to be capable of setting a gain value of a whole of the precedent stage amplifier circuit and the subsequent stage amplifier circuit to a plurality of values, wherein
the variable gain circuit is configured so that one of the gain value and a transconductance value of the precedent stage amplifier circuit can be set in conduction with the other and the precedent stage amplifier circuit sets the transconductance value to be smaller as the gain value is decreased.

* * * * *